(12) United States Patent
Patra

(10) Patent No.: US 10,928,734 B2
(45) Date of Patent: Feb. 23, 2021

(54) OPTICAL ASSEMBLY FOR GUIDING AN OUTPUT BEAM OF A FREE ELECTRON LASER

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/579,398

(22) Filed: Sep. 23, 2019

(65) Prior Publication Data

US 2020/0019064 A1 Jan. 16, 2020

Related U.S. Application Data

(63) Continuation of application No. PCT/EP2018/057167, filed on Mar. 21, 2018.

(30) Foreign Application Priority Data

Mar. 31, 2017 (DE) .................. 10 2017 205 548

(51) Int. Cl.
*G03F 7/20* (2006.01)
*G02B 5/02* (2006.01)
(Continued)

(52) U.S. Cl.
CPC .......... *G03F 7/7015* (2013.01); *G02B 5/0215* (2013.01); *G02B 5/0891* (2013.01);
(Continued)

(58) Field of Classification Search
CPC .......... G03F 1/84; G03F 7/702; G03F 7/7015; G02B 5/0215; G02B 6/0096
(Continued)

(56) References Cited

U.S. PATENT DOCUMENTS 5,896,438 A 4/1999 Miyake et al.
6,438,199 B1 8/2002 Schultz et al.
(Continued)

FOREIGN PATENT DOCUMENTS

DE 10 2009 025 655 A1 3/2010
DE 10 2013 223 808 A1 12/2014
(Continued)

OTHER PUBLICATIONS

International Search Report and Written Opinion for corresponding PCT Appl No. PCT/EP2018/057167, dated Jul. 6, 2018.
(Continued)

*Primary Examiner* — Hung Nguyen
(74) *Attorney, Agent, or Firm* — Fish & Richardson P.C.

(57) ABSTRACT

An optical assembly guides an output beam of a free electron laser to a downstream illumination-optical assembly of an EUV projection exposure apparatus. The optical assembly has first and a second GI mirrors, each with a structured reflection surface to be impinged upon by the output beam. A first angle of incidence on the first GI mirror is between one mrd and 10 mrad. A maximum first scattering angle is produced, amounting to between 50% and 100% of the first angle of incidence. A second angle of incidence on the second GI mirror is at least twice as large as the first angle of incidence. A maximum second scattering angle of the output beam amounts to between 30% and 100% of the second angle of incidence. The two planes of incidence on the two GI mirrors include an angle with respect to one another that is greater than 45°.

19 Claims, 15 Drawing Sheets

(51) Int. Cl.
  *G02B 5/08*    (2006.01)
  *G02B 6/10*    (2006.01)
  *G02B 17/06*   (2006.01)
  *G02B 27/28*   (2006.01)
  *G21K 1/06*    (2006.01)
  *H01S 3/09*    (2006.01)

(52) U.S. Cl.
  CPC ......... *G02B 6/102* (2013.01); *G02B 17/0605* (2013.01); *G02B 27/288* (2013.01); *G21K 1/067* (2013.01); *H01S 3/0903* (2013.01)

(58) Field of Classification Search
  USPC .................................. 355/53, 67–71
  See application file for complete search history.

(56) References Cited

U.S. PATENT DOCUMENTS

| | | | |
|---|---|---|---|
| 6,552,846 | B1 | 4/2003 | Suzuki |
| 6,658,084 | B2 | 12/2003 | Singer |
| 6,700,952 | B2 | 3/2004 | Dinger et al. |
| 10,042,248 | B2 * | 8/2018 | Degunther ........... G02B 6/0096 |
| 2003/0002022 | A1 | 1/2003 | Schultz |
| 2003/0043359 | A1 * | 3/2003 | Naulleau ................. G03F 7/702 355/71 |
| 2004/0140440 | A1 | 7/2004 | Schultz et al. |
| 2009/0174876 | A1 | 7/2009 | Schriever et al. |
| 2011/0014799 | A1 | 1/2011 | Dinger et al. |

FOREIGN PATENT DOCUMENTS

| | | |
|---|---|---|
| WO | WO 2009/121438 A1 | 10/2009 |
| WO | WO 2013/174644 A1 | 11/2013 |
| WO | WO 2014/139815 A1 | 9/2014 |
| WO | WO 2014/139881 A1 | 9/2014 |
| WO | WO 2015/078776 A1 | 6/2015 |
| WO | WO 2016/046088 A1 | 3/2016 |
| WO | WO 2016/139055 A2 | 9/2016 |
| WO | WO 2016/150612 A2 | 9/2016 |

OTHER PUBLICATIONS

German Office Action, with translation thereof, for corresponding Appl No. 10 2017 205 548.0, dated Nov. 7, 2017.

* cited by examiner

OPTICAL ASSEMBLY FOR GUIDING AN OUTPUT BEAM OF A FREE ELECTRON LASER

INCORPORATION BY REFERENCE

The contents of the International Patent Application PCT/EP 2018/057 167 and German Patent Application DE 10 2017 205 548.0 are incorporated by reference herein.

FIELD

The disclosure relates to an optical assembly for guiding an output beam of a free electron laser (FEL) to a downstream illumination-optical assembly of an EUV projection exposure apparatus. Further, the disclosure relates to a hollow waveguide assembly, in particular as a constituent part of such an optical assembly, and a magnet arrangement, in particular as a constituent part of such an optical assembly. Furthermore, the disclosure relates to an illumination optical unit having such an optical assembly for illuminating an object field with the output beam as illumination light and an optical system having such an illumination optical unit and a projection optical unit for imaging the object field in an image field, a projection exposure apparatus having such an illumination system and a projection optical unit, a method for producing a microstructured or nanostructured component using such a projection exposure apparatus, and a microstructured or nanostructured component produced by such a method.

BACKGROUND

A hollow waveguide for guiding EUV illumination light is known from WO 2014/139881 A1. WO 2013/174644 A1 has disclosed a facet mirror with scattering structures. Scattering structures as a constituent part of an optical assembly for simultaneously increasing etendue are moreover known from WO 2014/139815 A1. Hollow waveguides are moreover known from U.S. Pat. No. 6,552,846 B1 and WO 2016/046088 A1. WO 2015/078 776 A1 likewise describes an illumination system for EUV projection lithography using a free electron laser. DE 10 2013 223 808 A1 describes an optical mirror device for reflecting a beam of EUV light.

A projection exposure apparatus including an illumination system is known from US 2011/0 014 799 A1, WO 2009/121 438 A1, US 2009/0 174 876 A1, U.S. Pat. No. 6,438,199 B1 and U.S. Pat. No. 6,658,084 B2. Further component parts for EUV projection lithography are known from US 2003/0002022 A1, DE 10 2009 025 655 A1, U.S. Pat. No. 6,700,952 and US 2004/0140440 A. Further references from which an EUV light source is known are found in WO 2009/121 438 A1. EUV illumination optical units are furthermore known from US 2003/0043359 A1 and U.S. Pat. No. 5,896,438.

SUMMARY

The present disclosure seeks to develop an optical assembly of the type set forth at the outset in such a way that an output beam of an FEL can also be guided reliably and with a sufficient service life of the optical component parts if the FEL is arranged close to the optical assembly and hence there is a high peak intensity of the output beam, in any case on a guiding component part of the optical assembly.

The disclosure provides an optical assembly for guiding an output beam of a free electron laser to a downstream illumination-optical assembly of an EUV projection exposure apparatus is provided. The optical assembly includes a first GI mirror having a structured first reflection surface to be impinged upon by the output beam at a first angle of incidence that is measured in a first plane of incidence between the output beam and the first reflection surface. The first angle of incidence is greater than 1 mrad and less than 10 mrad. The structured first reflection surface produces a maximum first scattering angle of the output beam that amounts to at least 50% and at most 100% of the first angle of incidence. The optical assembly also includes a second GI mirror disposed downstream of the first GI mirror in the beam path of the output beam. The second GI mirror has a structured second reflection surface to be impinged upon by the output beam at a second angle of incidence that is measured in a second plane of incidence between the output beam and the second reflection surface. The second plane of incidence includes an angle with the first plane of incidence that is greater than 45°. The second angle of incidence is at least twice as large as the first angle of incidence. The structured second reflection surface produces a maximum second scattering angle of the output beam that amounts to at least 30% and at most 100% of the second angle of incidence.

According to the disclosure, it was recognized that two GI (grazing incidence) mirrors, i.e. mirrors on which the output beam of the FEL is incident under grazing incidence, arranged in succession ensure that the output beam can be guided by the optical assembly without too high peak intensities and/or a thermal load that is too high on account of residual absorption of the output beam occurring on the reflection surfaces of the component parts of the optical assembly. The structured reflection surfaces of the GI mirrors ensure a desired divergence increase of the output beam. There is a divergence increase in both transverse dimensions of the output beam on account of the angles between the two planes of incidence of the two GI mirrors. The divergence increase of the FEL output beam over at least two GI mirrors was found, quite surprisingly, to be an effective instrument for impressing a larger output divergence, which satisfies the desired properties of projection exposure, on the FEL output beam, which initially has a very small input divergence. An angle of incidence on the GI mirrors, measured not toward the reflection surface but measured toward the normal of the reflection surface, may be greater than 45°, may be greater than 50°, may be greater than 60°, may be greater than 70° and may also be greater than 80°. The scattering angles which are produced by the structured reflection surfaces of the GI mirrors are so large that the complete produced output divergence of the output beam can be reflected by the respective GI mirror. Measured to the reflection surface, the first angle of incidence may lie in a range between 1 mrad and 5 mrad. The maximum first scattering angle which the structured first reflection surface produces may lie in the range of between 50% and 95% of the first angle of incidence. The second angle of incidence may be at least three-times as large as the first angle of incidence. The maximum second scattering angle, which is produced by the structured second reflection surface, may lie in the range of between 30% and 90% of the second angle of incidence. Once again measured to the reflection surface, the second angle of incidence may be greater than 10 mrad and may amount to e.g. 30 mrad. An angle between the planes of incidence may be greater than 60°, may be greater than 70°, may be greater than 80° and may lie in the region of 90°. The structuring of the two reflection surfaces may be such that scattering is effectuated on account of the surface roughness of the reflection surfaces and/or on account of the diffraction at the structures of the reflection surfaces and/or on account of different reflection angles at a reflection surface that is correspondingly structured concavely or convexly on a macroscopic scale. Structuring of the reflection surfaces may be present with a typical length scale in the range between 1 µm and 10 µm. Alternatively, the structuring of the reflection surface may also be embodied with a very much larger typical length scale such that this results in a concavely or convexly arched reflection surface overall. An input divergence of the output beam of the FEL incident in the optical assembly may be less than 1 mrad, may be less than 0.8 mrad, may be less than 0.5 mrad and may amount to 0.3 mrad, for example. The optical assembly for guiding the FEL output beam may have a third GI mirror for further increasing the divergence of the output beam. Further mirrors, in particular further GI mirrors, may also still be provided in the optical assembly. A reflection surface of the first GI mirror and/or of the second GI mirror may have a plane embodiment. A reflection surface of the first GI mirror and/or of the second GI mirror may have a curved embodiment. The two GI mirrors may have a distance from one another along a beam path of the output beam that is less than 3 m, that is less than 2 m and that can lie in the region of 1 m.

In some embodiments, the first GI mirror is embodied such that a beam path between the FEL, and the first GI mirror is shorter than 8 m. In such embodiments, a compact arrangement of the FEL with the optical assembly for guiding the FEL output beam, disposed downstream thereof, arises. The advantages of reliably guiding even a concentrated and intensive FEL output beam then come particularly well into effect. The beam path between the FEL and the first GI mirror may also be shorter and may, for example, be shorter than 6 m and also be shorter than 5 m.

In some embodiments, the first GI mirror is embodied such that, in the case of a linearly polarized output beam, it reflects the latter with s-polarization. Such an arrangement of the first GI mirror facilitates a particularly high reflectivity since an s-polarization of the output beam can be reflected with a higher degree of reflection than a p-polarization, for example.

In some embodiments, a hollow waveguide is in the beam path of the output beam after the second GI mirror. Such a hollow waveguide facilitates good mixing of various divergence angles of the output beam and consequently a desired etendue increase and/or stabilization. An etendue stabilization is achieved when the etendue is kept within a tolerance range of e.g. 5%, 1% or an even smaller portion of a predetermined intended etendue. The hollow waveguide may have inner surfaces with a roughened reflection surface for a scattering and/or diffracting divergence increase. The hollow waveguide may have a rectangular internal cross section.

In some embodiments, reflecting inner surfaces of the hollow waveguide assume an angle in relation to at least one of the planes of incidence in the range of between 10° and 80°. Such an alignment of hollow waveguide inner surfaces leads to particularly good mixing of divergence angles in the transverse dimensions of the FEL output beam. This results in a hollow waveguide whose inner surfaces are tilted about a hollow waveguide longitudinal axis in relation to the planes of incidence, in particular to at least one of the planes of incidence. The hollow waveguide longitudinal axis itself may extend parallel to at least one of the planes of incidence. It may be advantageous if an angle that differs from zero is present between the hollow waveguide longitudinal axis and the direction of the output beam of the FEL incident in the hollow waveguide; this angle may be of the order of the divergence of the output beam of the FEL incident in the hollow waveguide.

In some embodiments, the optical assembly includes a further mirror disposed downstream of the hollow waveguide for shaping the beam of the output beam after emergence from the hollow waveguide. Such an arrangement extends the options of conditioning the FEL output beam for the illumination-optical assembly disposed downstream thereof. The further mirror may have a curved reflection surface.

In some embodiments, the optical assembly includes a further mirror arranged between the second GI mirror and the hollow waveguide in the beam path of the output beam, for shaping the beam of the output beam before entry into the hollow waveguide. Such an arrangement improves the options of conditioning the output beam to match the desired properties of the hollow waveguide disposed downstream thereof. This further mirror may have a curved reflection surface.

The disclosure also seeks to provide a hollow waveguide assembly for guiding an EUV light beam in such a way that an effective gas pressure separation of a beam path of the EUV light beam disposed upstream of the hollow waveguide from a beam path of the EUV light beam disposed downstream of the hollow waveguide is ensured.

The disclosure provides, a hollow assembly as a constituent part of an optical assembly disclosed herein. The hollow assembly includes a hollow waveguide for guiding an EUV light beam along a beam path. The hollow assembly also includes a first electrode that is arranged close to an entry of the EUV light beam into the hollow waveguide. The hollow assembly further includes a second electrode that is arranged close to an exit of the EUV light beam from the hollow waveguide. In addition, the hollow assembly includes an ionization light source causing impingement on a region of the beam path of the EUV light beam near at least one of the two electrodes.

According to the disclosure, it was recognized that the two electrodes and the ionization light source provide the option of effectively ionizing and discharging gas, for example purge gas, situated in the volume through which the EUV light beam passes. This facilitates an effective gas pressure separation. At least one of the electrodes may be embodied as a ring electrode, the ring opening of which is embodied for the passage of the EUV light beam. The ionization light source can have an emission wavelength in the range between 70 nm and 90 nm. This results in photons with an effective cross section that is sufficiently large for ionizing gas atoms. This allows, in particular, an ionization of hydrogen.

The disclosure further seeks to provide a magnet arrangement which diverts metal atoms, which are carried along in an EUV beam path, out of the beam path as efficiently as possible.

The disclosure provides a magnet arrangement as a constituent part of an optical assembly disclosed herein. The magnet arrangement includes at least one magnet pole shoe pair for producing a magnetic field with field lines that extend transversely to an EUV beam path of an EUV light beam. The magnet pole shoe pair produces a magnetic field which leads to a deflection of the metal atoms. The carried-along metal atoms may be, in particular, atoms of a mirror coating material and/or of a mirror material, for example ruthenium atoms.

In some embodiments, the magnet arrangement further includes at least one further magnet pole shoe pair for producing a magnetic field with field lines that extend transversely to an EUV beam path of an EUV light beam and transversely to the field lines of the other magnet pole shoe pair. Such an arrangement having at least two magnet pole shoe pairs facilitates a particularly effective diversion of the metal atoms since even atoms with integer angular momentum are deflected with a higher probability.

The magnet pole shoe pairs may be designed such that they produce inhomogeneous magnetic fields. To this end, one of the poles may be embodied with a tip or an edge and a facing further pole of the pole shoe pair may be embodied with an assigned groove which, in particular, extends parallel thereto.

In some embodiments, the disclosure provides an illumination optical unit having an optical assembly as disclosed herein. The illumination optical unit illuminates an object field with the output beam. An object to be imaged by the EUV projection exposure apparatus is arrangeable in the object field. The advantages of such an illumination optical unit correspond to those which were explained above with reference to the optical assembly. Alternatively, the optical assembly can be an upgrade assembly for an existing illumination optical unit. In the case of such an upgrade, the optical assembly may be embodied in such a way that it is not an entire diameter of a downstream illumination optical unit component part that is impinged. The illumination-optical assembly, which is disposed downstream of the optical assembly for guiding the FEL output beam, may be embodied in such a way that it defines an illumination angle distribution of the illumination light over the object field. This illumination-optical assembly may have, in particular, a field facet mirror and a pupil facet mirror, as is known per se from the prior art. Alternatively, this illumination-optical assembly may also be designed in the style of a specular reflector, as is likewise known per se from the prior art. The illumination-optical assembly for defining the illumination angle distribution of the illumination light over the object field may have at least one facet mirror which is embodied as a MEMS (microelectromechanical system) mirror. Such a MEMS embodiment is also known, in principle, from the prior art.

In some embodiments, the disclosure provides an optical system having an illumination optical unit as disclosed herein and also having a projection optical unit for imaging the object field into an image field in which a wafer is arrangeable. The advantages of such an optical system correspond to those which have already been explained above with reference to the optical assembly and the illumination optical unit. The optical system may have an FEL as a light source for illumination and/or imaging light.

In some embodiments, the disclosure provides a projection exposure apparatus having an optical system disclosed herein and an FEL as a light source for the illumination light. In some embodiments, the disclosure provides a method of using such a projection exposure apparatus to produce microstructured or nanostructured components. In some embodiments, the disclosure provides microstructured or nanostructured components produced by such a method. The advantages of such a projection exposure apparatus, such a method, and such a component correspond to those that have already been explained above with reference to the optical assembly, the illumination optical unit and the optical system. The microstructured or nanostructured component can be a semiconductor chip, in particular a highly integrated memory chip.

BRIEF DESCRIPTION OF THE DRAWINGS

Exemplary embodiments are explained in greater detail below with reference to the drawings. In the drawings.

DESCRIPTION OF EXEMPLARY EMBODIMENTS

Figure 1:
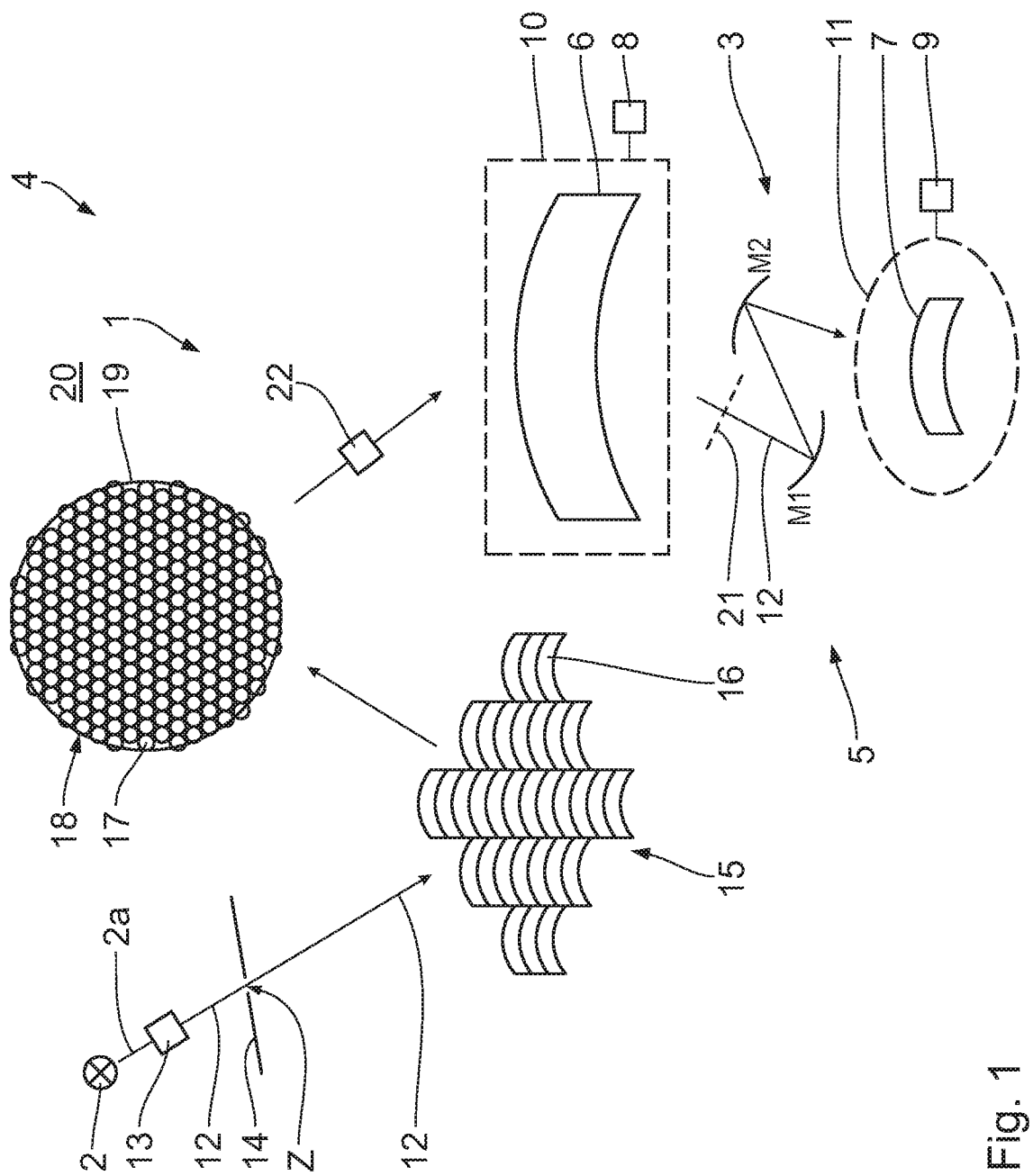
FIG. 1 schematically shows principal component parts of a projection exposure apparatus for EUV projection lithography, including an optical assembly for guiding an output beam of an FEL (free electron laser) to an illumination-optical assembly of the projection exposure apparatus disposed downstream thereof.

FIG. 1 schematically shows an illumination optical unit 1, a light source 2 and an imaging optical unit or projection optical unit 3 of a projection exposure apparatus 4 for EUV microlithography. In addition to the illumination optical unit 1, which serves to illuminate an object field 6 of the projection exposure apparatus, an illumination system 5 of the projection exposure apparatus 4 has the projection optical unit 3 for imaging the object field 6, which lies in an object plane, into an image field 7 in an image plane. In addition to the illumination system 5 and the EUV light source 2, the projection exposure apparatus 4 still has, in particular, a plurality of mechanical component parts, holders 8, 9 for a reticle 10, illustrated by a dashed line in FIG. 1, that is arranged in the object plane and for a wafer 11, illustrated by a dashed line in FIG. 1, that is arranged in the image plane. A structure on the reticle 10 is imaged onto a light-sensitive layer of the wafer 11 arranged in the region of the image field 7 in the image plane.

The imaging optical unit 3 is embodied as a catoptric optical unit having a plurality of mirrors, two mirrors M1, M2 of which are illustrated schematically in FIG. 1. As a rule, the imaging optical unit 3 has a greater number of mirrors, for example four, six or eight mirrors.

The light or radiation source 2 is an EUV (extreme ultraviolet) light source having an emitted used radiation in the range of between 5 nm and 30 nm. The light source 2 is a coherent light source. A wavelength band used for the EUV projection exposure or a target wavelength range of the EUV radiation 12 lies at 13.5 nm ±1 nm, for example, but it may also lie in the range of between 5 nm and 8 nm, for example. The EUV radiation 12 is also referred to below as illumination and imaging light or as used emission. A different target wavelength range is also possible, for example between 5 nm and 17 nm. A bandwidth of the employed EUV wavelength band may be greater than 0.1 nm and may lie, in particular, between 0.1 nm and 2 nm. A typical bandwidth of the employed EUV radiation 12 is 1% of the central wavelength.

The light source 2 is a synchrotron source or a source on the basis of a free electron laser (FEL). A mean power of the FEL 2 may lie in the range of between 100 W and 10 kW and may amount to 1 kW. A pulse frequency of the FEL 2 may lie in the range of between 10 MHz and 500 MHz and, in particular, lie in the region of 100 MHz. The light source 2 has an etendue which is less than $10^{-7}$ m$^2$ or 0.1 mm$^2$. The etendue of the light source 2 may be less than $10^{-12}$ m$^2$; in particular, it may amount to between $10^{-16}$ m$^2$ and $10^{-13}$ m$^2$. The etendue 2 is the smallest volume of the phase space containing 90% of the light energy. A wavelength bandwidth of the light source may approximately equal the usable bandwidth of the illumination optical unit 1 and/or of the projection optical unit 3, and may amount to between 7 pm and 650 pm, for example.

Disposed downstream of the light source 2 in the beam path of the used emission 12 there is an optical assembly 13 for guiding an output beam 2a of the FEL 2 to a downstream illumination-optical assembly of the illumination optical unit 1 and, in particular, for simultaneously increasing etendue of the used emission 12 of the light source 2. A beam diameter of the output beam 2a lies in the region of 30 µm. A divergence of the output beam 2a directly after the FEL 2 lies in the range of between 0.1 mrad and 1 mrad, for example in the range between 0.2 mrad and 0.5 mrad, and it may lie at 0.3 mrad. The optical assembly 13 is only indicated schematically in FIG. 1. Embodiments of the optical assembly 13 will be explained below.

The produced EUV radiation 12 with the increased etendue propagates through an intermediate focal plane 14 before it is incident on a field facet mirror 15 with field facets 16, the latter being impinged upon by illumination light 12. The field facets 16 are arcuate but may also have a rectangular design. A different form of the field facets 16 is also possible.

In the intermediate focal plane 14, the EUV radiation has an intermediate focus Z, i.e. a location with the smallest transverse extent. Depending on the embodiment of the illumination optical unit 1, it is also possible to dispense with the formation of such an intermediate focus Z after the optical assembly 13.

The EUV radiation 12 reflected by the field facet mirror 15 is constructed from a multiplicity of illumination channels, i.e. radiation partial beams, with each partial beam being reflected by a certain field facet 16. Each partial beam is incident, in turn, on a pupil facet 17 of a pupil facet mirror 18, the pupil facet being assigned to the partial beam by way of the illumination channel.

The pupil facets 17 are arranged on a common carrier plate 19 of the pupil facet mirror 18. The pupil facet mirror is arranged in an illumination pupil plane 20. The pupil facets 17 have a round embodiment. Alternatively, a hexagonal or rectangular embodiment of the pupil facets 17 is also possible. The pupil facets 17 have a close-packed arrangement. Using the field facet mirror 15, secondary light sources are produced at the location of the pupil facets 17 of the pupil facet mirror 18. The pupil facet mirror 18 is arranged in a plane of the illumination optical unit 1, which coincides with, or is optically conjugate with respect to, a pupil plane 21 of the projection optical unit 3. An intensity distribution of the EUV radiation 12 on the pupil facet mirror 17 is therefore directly correlated to an illumination angle distribution of an illumination of the object field 6 in the object plane and an illumination of the image field 7 in the image plane.

The two facet mirrors 15, 18 are an illumination-optical assembly of the projection exposure apparatus 4 for defining the illumination angle distribution of the illumination light 12 over the object field 6.

With the aid of the pupil facet mirror 18 and an imaging optical assembly in the form of a schematically indicated transfer optical unit 22, the field facets 16 of the field facet mirror 15 are imaged into the object field 6. Embodiments of the projection exposure apparatus 4 in which the illumination pupil plane 20 coincides with the projection optical unit pupil plane 21 are also possible. In such a case, it is also possible to dispense with the transfer optical unit 22.

Figure 2:
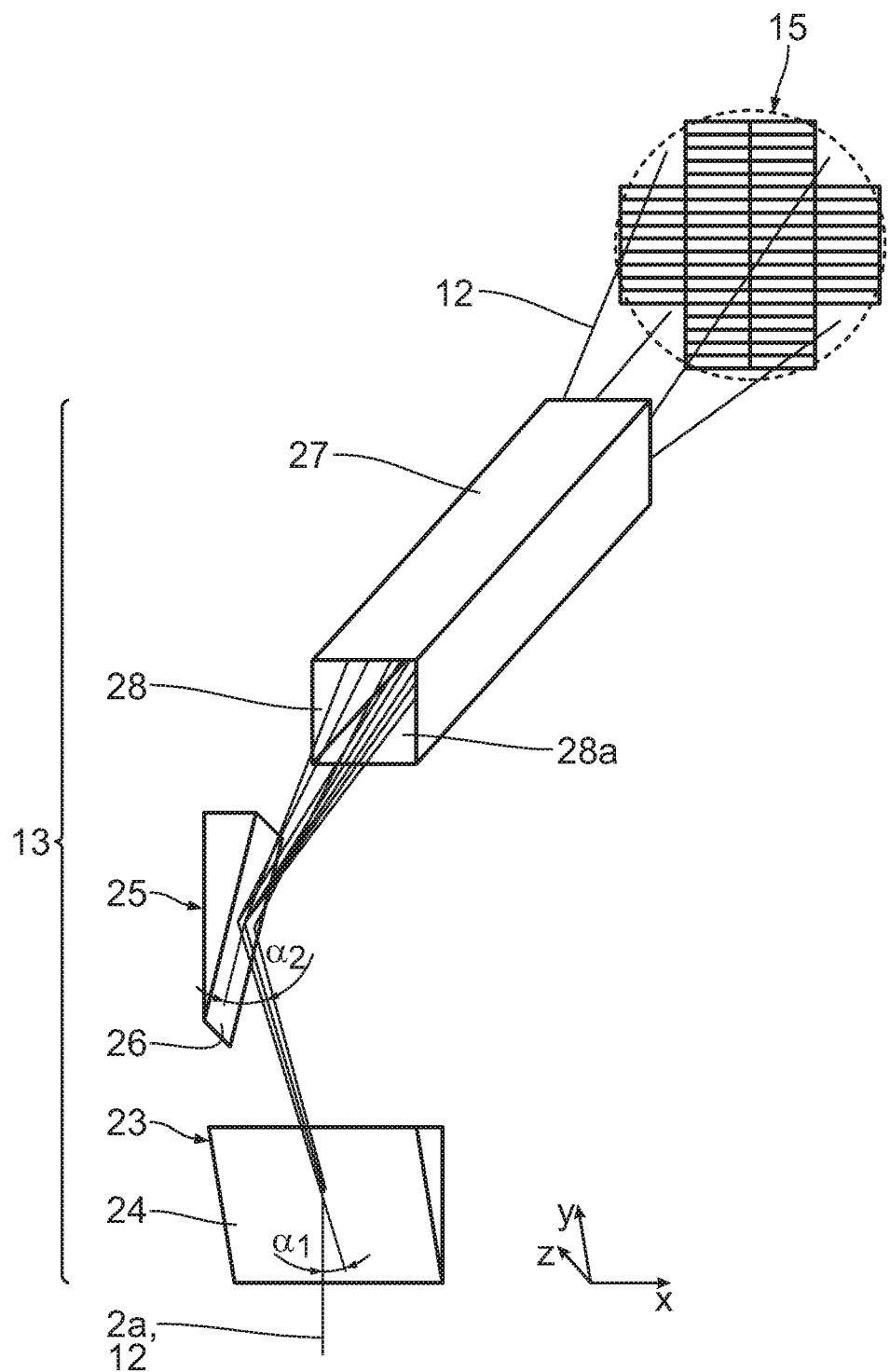
FIG. 2 shows an embodiment of the optical assembly between the FEL and a field facet mirror as a first component part of the downstream illumination-optical assembly.

FIG. 2 shows the construction of the optical assembly 13 between the FEL 2 and the field facet mirror 15 in more detail.

Disposed downstream of the FEL 2 there is a first mirror 23 for grazing incidence of the output beam 2a, which is also referred to as a GI (grazing incidence) mirror. A beam path between the FEL 2 and the first GI mirror 23 is shorter than 5 m.

The first GI mirror 23 has a structured first reflection surface 24 to be impinged upon by the output beam 2a. This reflection surface structuring serves to scatter the output beam 2a on account of a surface roughness of the first reflection surface 24 and/or to diffract the output beam 2a in a divergence-increasing manner. The structuring of the first reflection surface 24 has a typical length scale of 5 µm.

In order to simplify positional relationships, use is made below of a Cartesian xyz-coordinate system, which is illustrated in perspective in FIG. 2.

A first plane of incidence, in which the output beam 2a is incident on the first reflection surface 24 of the first GI mirror 23, extends parallel to the yz-plane.

The output beam 2a is incident on the first reflection surface 24 in the first plane of incidence yz at a first angle of incidence $\alpha_1$, measured in the plane of incidence yz between the output beam 2a (or a chief ray characterizing the beam direction of the output beam 2a) and the reflection surface 24. The first angle of incidence $\alpha_1$ is 3 mrad.

Figure 3:
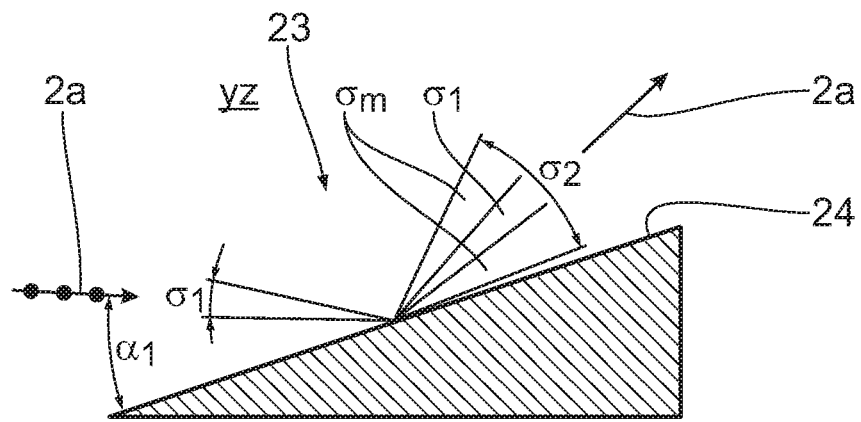
FIG. 3 shows schematic angle relationships during the reflection of the output beam at a GI mirror of the optical assembly according to FIG. 2 with a structured, plane reflection surface for increasing a divergence of the output beam.

FIG. 3 shows divergence relationships during the reflection of the output beam 2a, for example at the first GI mirror 23, in more detail. In addition to the angle of incidence $\alpha_1$, an input divergence $\sigma_1$ of the output beam 2a is also illustrated schematically. This input divergence is 0.3 mrad. The chief ray of the output beam 2a, which is decisive for measuring the angle of incidence, extends centrally within this input divergence $\sigma_1$.

On account of the scattering or diffractive effect of the structuring of the reflection surface 24, there is an increase of the input divergence $\sigma_1$ in the plane of incidence yz to both sides of the extremal individual rays that represent the input divergence, in each case by a maximum scattering angle $\sigma_m$, and so an output divergence $\sigma_2$ arises, the following applying thereto:

$$\sigma_2 = \sigma_1 + 2 \cdot \sigma_m.$$

The angle of incidence $\alpha_1$ is dimensioned such that half of this output divergence $\sigma_2$ is less than the angle of incidence $\alpha_1$. It thus holds true that:

$$\sigma_2/2 < \alpha_1.$$

A produced scattering angle equals half the output divergence or it is insubstantially smaller, for example by half of the input divergence.

The above relation thus means that the scattering angle produced by the structuring of the reflection surface 24 is less than the angle of incidence $\alpha_1$. In particular, this relation applies to all incidence beam directions of the output beam 2a incident on the first reflection surface 24. These actual angles of incidence vary about the angle of incidence $\alpha_1$ of the chief ray characterizing the beam direction of the output beam 2a, in a region with the limit values of $\alpha_1 - \sigma_1/2$ and $\alpha_1 + \sigma_1/2$. The structured first reflection surface 24 produces a maximum first scattering angle $\sigma_2/2$, which is less than the first angle of incidence $\alpha_1$ and which may lie in the range of between 50% and 100% of the first angle of incidence $\alpha_1$. Thus, the scattering at the first reflection surface 24 can ensure that scattered illumination light 12 is output in a more grazing fashion in relation to the first reflection surface 24 after the reflection than during the incidence on the first reflection surface 24.

An incidence spot of the output beam 2a on the reflection surface 24 has an extent of approximately 10 mm in the yz-plane on account of the grazing incidence and, perpendicular thereto, i.e. in the x-direction, it has an extent of 30 μm. Thus, a 300-times magnification of the extent of the incidence spot in the plane of incidence yz emerges on account of the grazing incidence. For a core region of highest intensity of the output beam 2a, these incidence spot dimensions are 3 mm×10 μm. This area of the incidence spot is so large that there is neither an ablation of mirror or coating material of the reflection surface 24 nor damage to the GI mirror 23 on account of a heat influx by way of residual resorption of the output beam 2a that is too high.

The output divergence $\sigma_2$ of the output beam 2a after reflection at the first GI mirror 23 amounts to 3 mrad in the plane of incidence yz; i.e., it is increased by a factor of 10 in relation to the input divergence $\sigma_1$. Perpendicular thereto, there has been practically no change in the output divergence in comparison with the input divergence.

After reflection at the GI mirror 23, the output beam 2a is incident on a second GI mirror 25 of the optical assembly 13. This second GI mirror 25 has a second reflection surface 26 and a structure like that of the first GI mirror 23 in respect of its reflection structuring. The two reflection surfaces 24, 26 and all other reflection surfaces for the EUV light 12, which are described here, carry a coating that is highly reflective for the EUV light 12. Here, this may be a ruthenium coating.

The output beam 2a is reflected in a second plane of incidence by the second GI mirror 25, the second plane of incidence lying parallel to the xy-plane, i.e. perpendicular to the first plane of incidence yz of the first GI mirror 23. Such a mutually perpendicular arrangement of the planes of incidence of the two GI mirrors 23, 25 is not mandatory. It suffices for the second plane of incidence to include an angle with the first plane of incidence that is greater than 45°.

The output beam 2a is incident on the second reflection surface 26 of the second GI mirror 25 in the second plane of incidence xy at a second angle of incidence $\alpha_2$ which is measured between a central chief ray of the output beam 2a and the second reflection surface 26. The second angle of incidence $\alpha_2$ is 30 mrad and at least twice as large as the first angle of incidence $\alpha_1$ on the first GI mirror 23.

An output divergence production by the second reflection surface 26 corresponds to what was explained above in conjunction with FIG. 3 for the first GI mirror 23, but now in the xy-plane. The second GI mirror 25 produces an output divergence $\sigma_2$, the following, in turn, applying thereto:

$$\sigma_2/2 < \alpha_2.$$

Accordingly, the maximum second scattering angle $\sigma_2/2$ of the second GI mirror 25 is less than the second angle of incidence $\alpha_2$ and lies, in particular, in the range of between 30% and 100% of the second angle of incidence $\alpha_2$.

In the beam path of the output beam 2a, the two GI mirrors 23 and 25 have a distance from one another that is shorter than 3 m and may amount to 1 m, for example.

An incidence spot of the output beam 2a on the second GI mirror 25 has an extent of approximately 10 mm in the grazing plane of incidence xy and, perpendicular thereto, an extent of approximately 3 mm on account of the output divergence produced by the first GI mirror 23.

The maximum scattering angles $\sigma_2$ of the first GI mirror 23 and the second GI mirror 25 need not have the same absolute value. A maximum scattering angle of the second GI mirror 25 may be significantly larger than that of the first GI mirror 23 and may amount to two times, three times, five times, eight times or even ten times the scattering angle of the first GI mirror 23, for example.

To the extent that the output beam 2a is linearly polarized, the first GI mirror 23 is embodied such that it reflects the output beam 2a with s-polarization. This is indicated in FIG. 3, where a linear polarization extending in the x-direction is indicated in the incoming output beam 2a, the linear polarization extending perpendicular to the plane of incidence yz such that, thus, an s-polarization of the output beam 2a is present upon reflection at the GI mirror 23.

A hollow waveguide 27 for the output beam 2a, i.e. for the EUV radiation 12, is arranged downstream of the second GI mirror 25 in the beam path of the optical assembly 13. In respect of the basic design, such a hollow waveguide is known from WO 2014/129 881 A1. The hollow waveguide 27 has a rectangular internal cross section which, in particular, may deviate from a square cross section. Inner walls 28, 28a of the hollow waveguide 27 are embodied as roughened reflection surfaces for further divergence-increasing scattering of the output beam 2a. Alternatively, the inner walls may also be embodied for a divergence increase of the output beam 2a by diffraction. The hollow waveguide 27 can be pivoted about its longitudinal axis in relation to the arrangement made of the two GI mirrors 23, 25 in such a way that the reflecting inner surfaces 28, 28a assume an angle that lies in the range of between 10° and 80° in relation to at least one of the two planes of incidence xy, yz, i.e. the reflecting inner surfaces are neither arranged in parallel with nor perpendicular to this plane of incidence. A corresponding pivot angle of the hollow waveguide 27 about its longitudinal axis may amount to 20°, 30° or else 45°, for example.

In an alternative embodiment not illustrated here, the hollow guide 27 has a cross-sectional form of a polygon with a number of corners that differs from four, for example three, five, six or more corners.

The field facet mirror 15 of the illumination optical unit 1 is disposed downstream of the hollow waveguide 27 in the beam path of the output beam 2a or of the EUV light 12.

Figure 4:
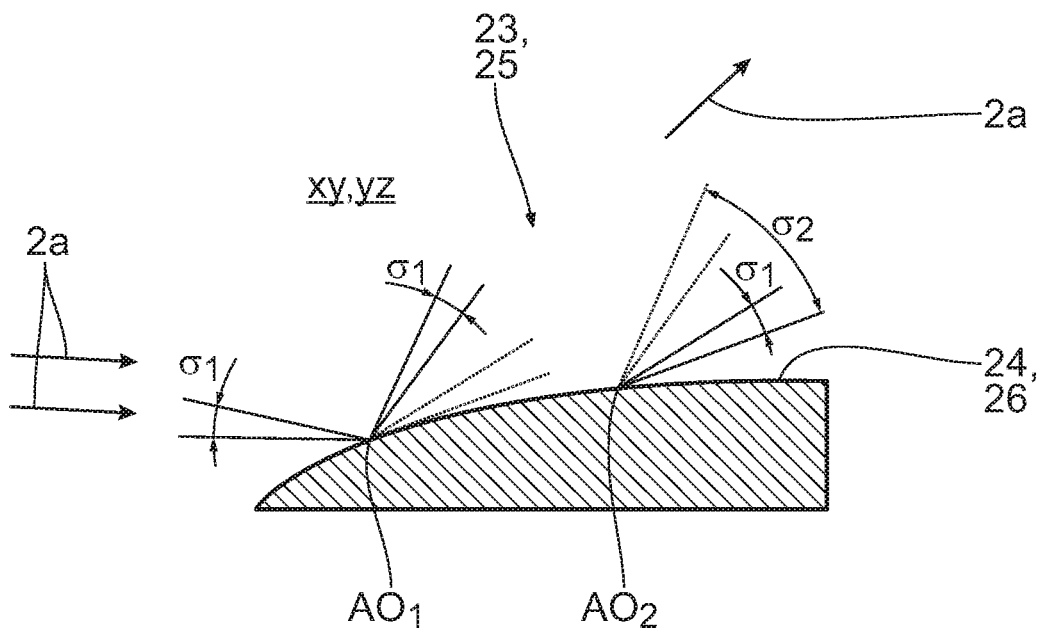
FIG. 4 shows schematic angle relationships during the reflection of the output beam at a GI mirror of the optical assembly according to FIG. 2 with a structured, curved reflection surface for increasing a divergence of the output beam.

A variant of the structuring of the reflection surfaces 24, 26 of the GI mirrors 23, 25 is explained on the basis of FIG. 4, the variant being able to be used alternatively or additionally to roughening or diffraction structuring, which were explained above in conjunction with FIG. 3, in particular. Component parts and functions corresponding to those which were already explained above with reference to FIGS. 1 to 3 have the same reference signs and are not discussed again in detail.

In the embodiment according to FIG. 4, the structuring of the reflection surfaces 24 and 26 is provided by curvature of the reflection surface 24 or 26. This curvature is convex in the illustrated embodiment.

An advantageous form of the reflection surface 24, 26 may be a root-shaped curve, i.e. the sagittal height along the direction illustrated vertically in FIG. 4 forms a root function as a function of the direction illustrated horizontally in FIG. 4.

On account of this curvature, an output divergence $\sigma_2$ emerging as a superposition of the reflected input divergences $\sigma_1$, which are reflected at the different incidence locations of the individual rays of the output beam 2a by the curved reflection surface 24 or 26, emerges for an incident beam of the output beam 2a. In FIG. 4, this is illustrated schematically for two incidence locations $AO_1$ and $AO_2$. An angle of incidence on the curved reflection surface 24 or 26 is desirably not be smaller in this case than half the input divergence, $\sigma_1/2$.

In the case of the curved reflection surface 24 or 26, the overall output divergence $\sigma_2$ emerges as a superposition of the input divergences $\sigma_1$ reflected at the various incidence locations $AO_i$, as illustrated schematically in FIG. 4 at the right incidence location $AO_2$. Here, the output divergence $\sigma_2$ emerges from the maximum difference between the angles of incidence $\alpha_1$ of the output beam 2a at the various incidence points $AO_i$. In the case of the curved reflection surface 24 or 26, the angle of incidence emerges as the angle between the chief ray of the input divergence $\sigma_1$ and a tangent at the respective incidence location $AO_i$ in the plane of incidence yz or xy.

Consequently, in the case of an input divergence $\sigma_1$ of 0.3 mrad, a smallest angle of incidence $\alpha_1$ emerges where the most grazing incidence of the output beam 2a is effectuated on account of the curvature of the reflection surface 26, the incidence having to be greater than half the input divergence $\sigma_1$, i.e. amount to at least 0.15 mrad.

In fact, the angle of incidence $\alpha_1$ is regularly significantly larger than this minimum admissible angle of incidence and may lie in the range of between 10 mrad and 30 mrad, for example.

Figure 15:
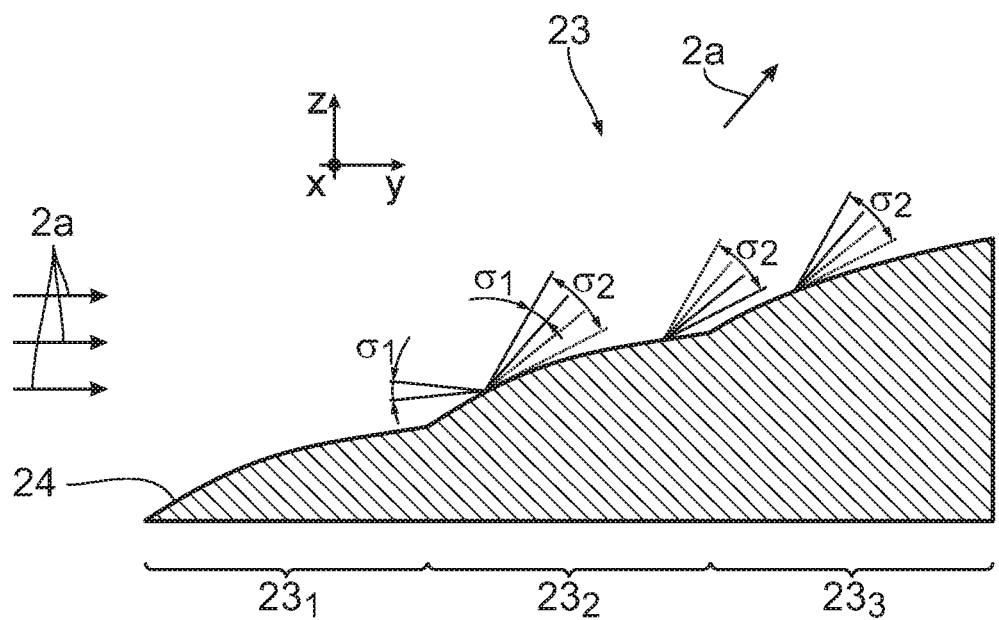
FIGS. 15 and 16 show illustrations, similar to FIG. 4, of a design of a GI mirror of the optical assembly according to FIG. 2.

FIG. 15 is used to explain a variant of the structuring of the reflection surface 24 of the GI mirror 23. This variant is also advantageously usable for the GI mirror 25, but offers further advantages for the GI mirror 23.

For a more in-depth explanation, the x-, y- and z-coordinate axes are plotted in FIG. 15. The GI mirror 23 consists of convex regions $23_1$, $23_2$, . . . , in which the reflection surface 24 has an identical embodiment apart from a height offset; i.e., the reflection surface 24 is periodic between the regions $23_1$, $23_2$, . . . apart from a height offset, i.e. apart from an offset in the z-direction of FIG. 15.

An advantageous form of the reflection surface 24 may be a local root-shaped curve, i.e. the sagittal height along the direction z illustrated vertically in FIG. 15 forms, within one of the regions $23_1$, $23_2$, . . . a root function as a function of the direction y illustrated horizontally in FIG. 15.

The extent of the incident output beam 2a is indicated in the figure by the maximum z-distance of the incident arrows. Indicating the extent of the outgoing output beam 2a was dispensed with. The periodicity of the reflection surface 24 in the z-direction is of order of the extent of the incident output beam 2a; in particular, the periodicity may amount to a tenth to two times the extent of the incident output beam. By way of example, the periodicity of the reflection surface 24 in the z-direction may amount to 3 µm to 50 µm. On account of the grazing incidence, the period of the reflection surface 24 along the y-direction is significantly longer and may amount to between 0.3 mm and 10 mm, for example.

A configuration according to FIG. 15 offers the advantage that a displacement of the incident output beam 2a in the z-direction does not lead to a change, or only leads to a reduced change, in the output divergence $\sigma_2$ of the outgoing output beam 2a. The reflection surface 24 can be configured in such a way that there is no scattering of the EUV radiation 12 of the output beam 2a at microstructures but that all scattering is based on the deflection of EUV radiation on geometric optics. This may be advantageous to the effect of avoiding the occurrence of speckle or of reducing the strength of possibly occurring speckle.

Figure 16:
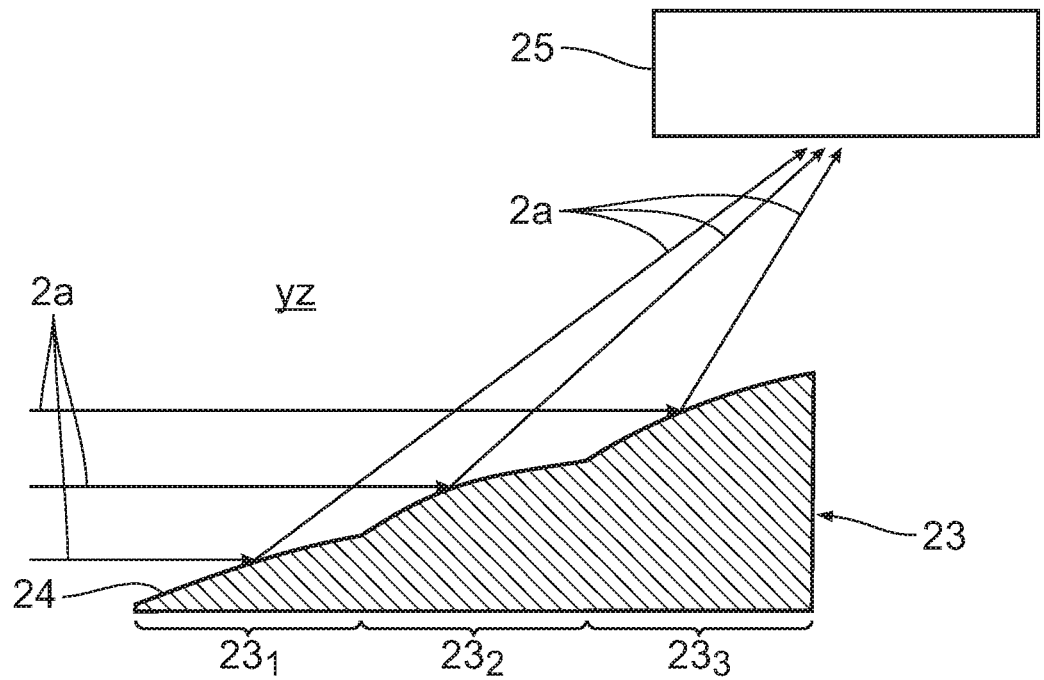

FIG. 16 is used to explain a variant of the embodiment shown in FIG. 15. Component parts corresponding to those which were already explained above with reference to FIG. 15 have the same reference signs and are not discussed again in detail.

In the embodiment according to FIG. 16, the reflection surface 24 of the GI mirror 23 is still periodic, within the meaning described above, in relation to the convex basic form of the regions $23_i$. However, the individual regions $23_i$ are slightly tilted about the x-axis in relation to one another such that the incident output beam 2a, which is incident on points in the individual regions $23_1$, $23_2$, . . . , which have the same effect in the z-height in respect of the basic form, is steered to substantially the same point of incidence on the following GI mirror 25. Substantially the same effect is provided by a configuration in which the reflection surface 24 of the GI mirror, in addition to the convex structuring of the individual regions $23_i$, is provided with a concave form that is long-range in comparison with the extent of these regions $23_i$, i.e. in which the reflection surface is embodied as a converging mirror.

Figure 5:
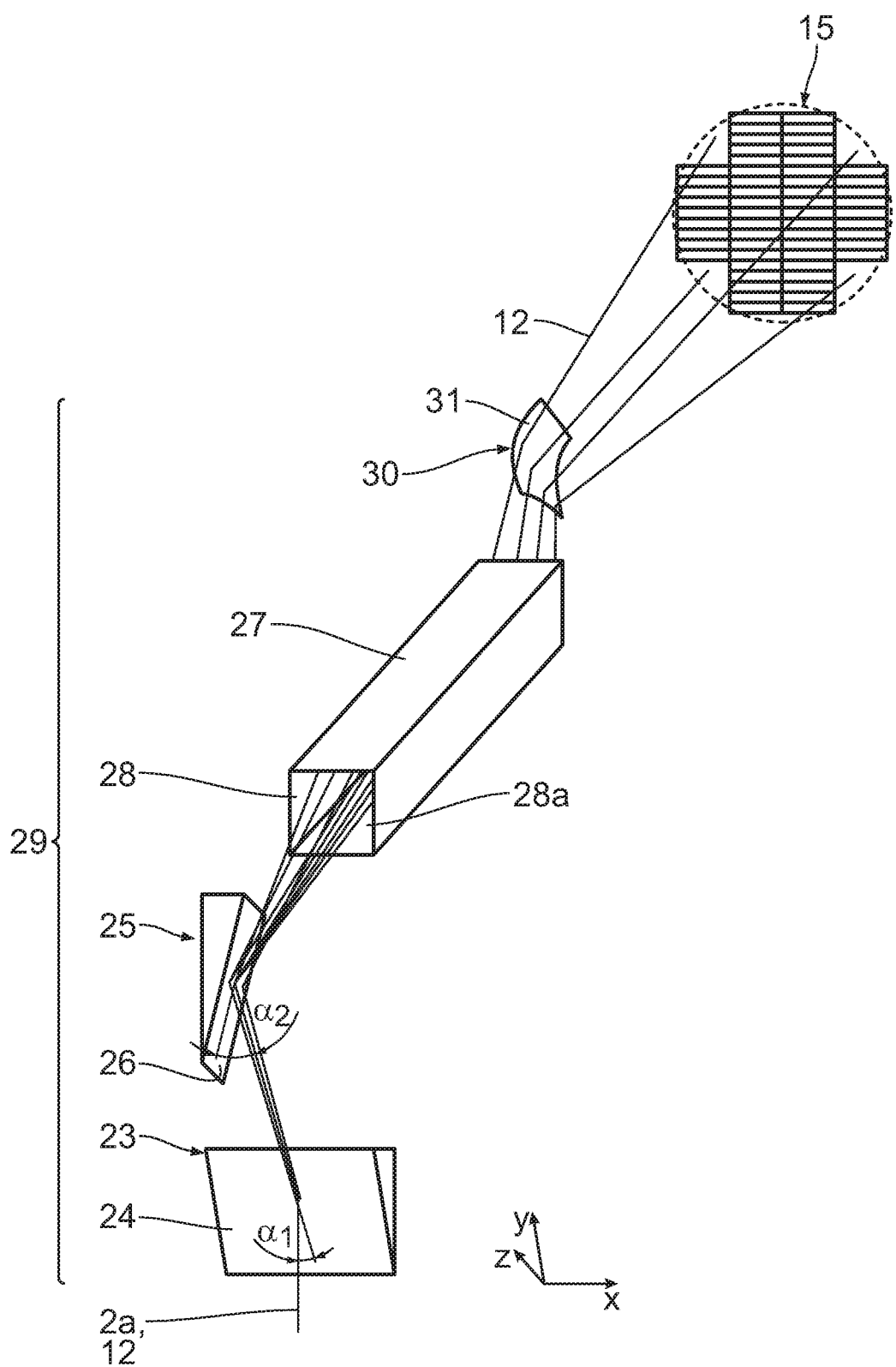
FIG. 5 shows, in an illustration similar to FIG. 2, a further embodiment of an optical assembly, which can be used in place of the one according to FIG. 2.

With reference to FIG. 5, an explanation is given below of a further embodiment of an optical assembly 29, which can be used instead of the optical assembly 13 in the projection exposure apparatus 4 according to FIG. 1. Component parts and functions which were already explained above with reference to FIGS. 1 to 4 have the same reference signs and are not discussed again in detail.

A further mirror 30 for shaping the beam of the output beam 2a after the emergence thereof from the hollow waveguide 27 is arranged between the hollow waveguide 27 and the field facet mirror 15 in the case of the optical assembly 29. This further mirror 30 is a GI mirror. Alternatively, provision in this case can also be made of a mirror for an angle of incidence of the output beam 2a of less than 45° between the normal of the respective reflection surface and the chief ray of the output beam 2a, i.e. an NI (normal incidence) mirror.

The mirror 30 has a reflection surface 31 with a curved embodiment, which is concave in the illustrated case. The latter serves to shape the output beam 2a in such a way that the field facet mirror 15 is completely illuminated by the illumination light 12.

In a further embodiment, not illustrated here, a plurality of mirrors are arranged, instead of the further mirror 30, for shaping the beam of the output beam 2a after emergence from the hollow waveguide 27. By way of example, such an arrangement can be embodied as a Wolter collector.

Figure 6:
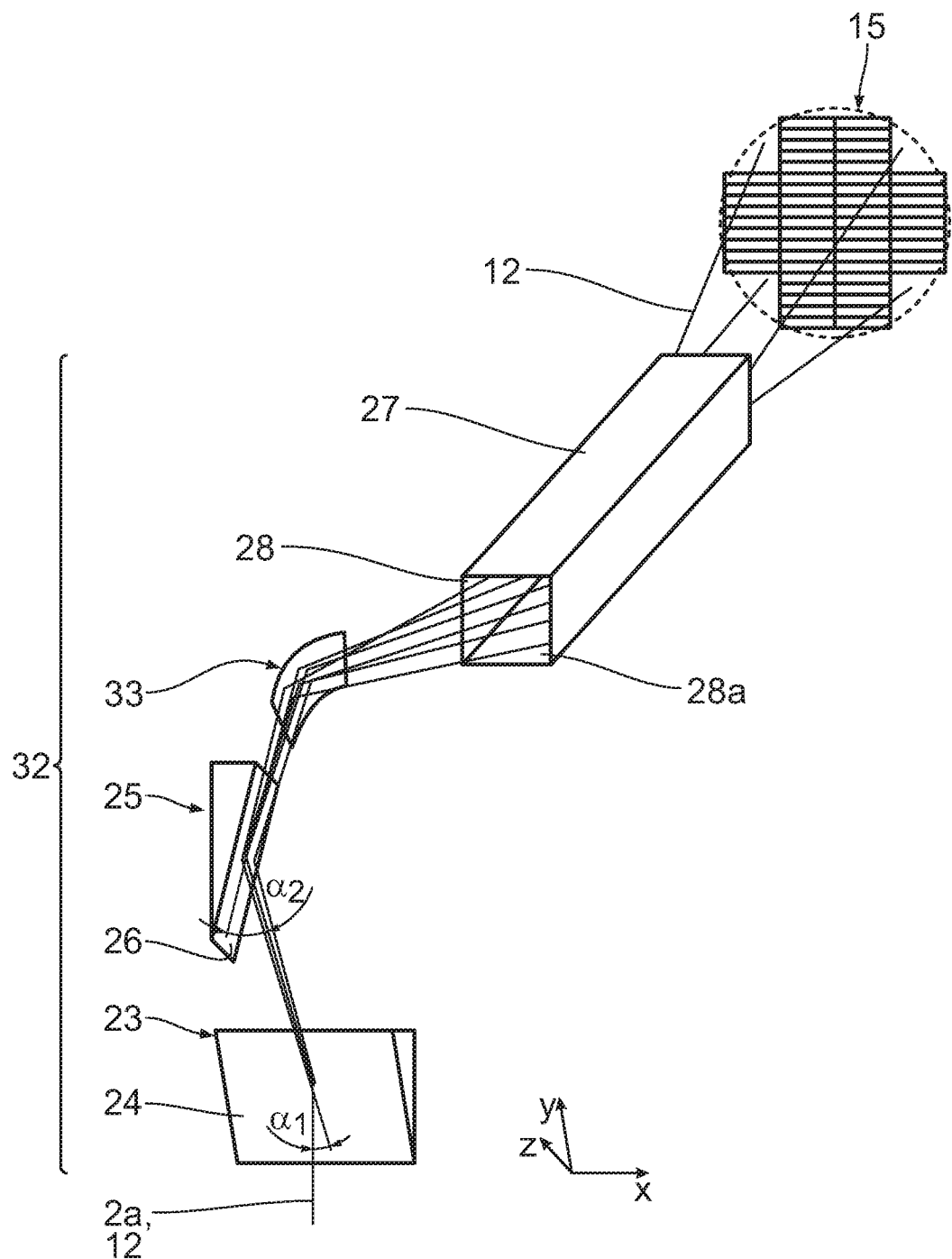
FIGS. 6 to 9 show further embodiments of an optical assembly, which can be used in place of the one according to FIG. 2.

With reference to FIG. 6, an explanation is given below of a further embodiment of an optical assembly 32, which can be used instead of the optical assembly 13 in the projection exposure apparatus 4 according to FIG. 1. Component parts and functions which were already explained above with reference to FIGS. 1 to 5 have the same reference signs and are not discussed again in detail.

In contrast to the optical assembly 13, the optical assembly 32 has a further mirror 33, between the second GI mirror 25 and the hollow waveguide 27 in the beam path of the output beam 2a, for shaping the beam of the output beam 2a before entry of the latter into the hollow waveguide 27. This further mirror 33 serves to condition the output beam 2a in such a way that it is matched well to the desired properties of the hollow waveguide 27 in respect of the beam cross section and the beam divergence upon entry into the hollow waveguide 27.

Figure 7:
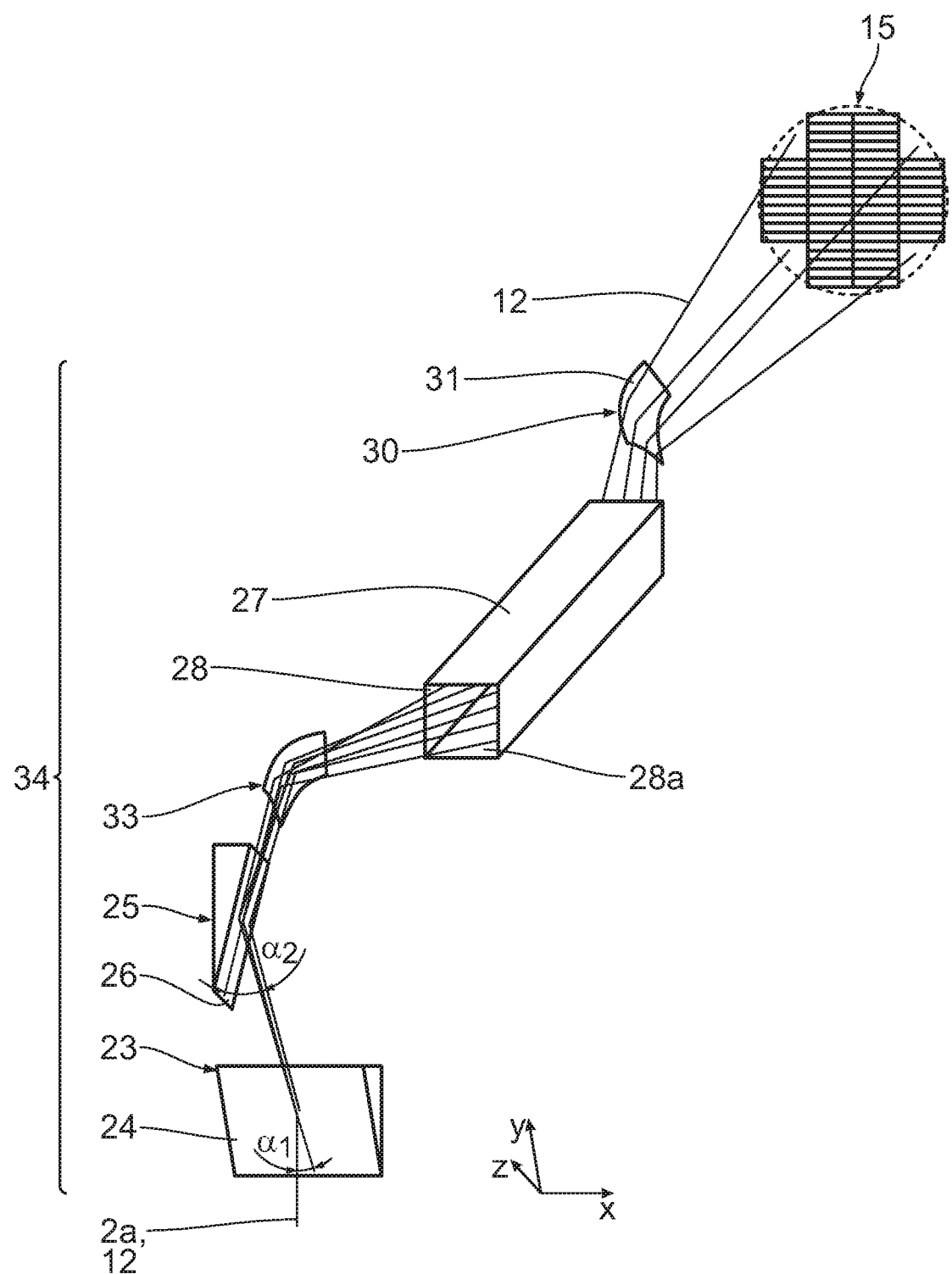

With reference to FIG. 7, an explanation is given below of a further embodiment of an optical assembly 34, which can be used instead of the optical assembly 13 in the projection exposure apparatus 4 according to FIG. 1. Component parts and functions which were already explained above with reference to FIGS. 1 to 6 have the same reference signs and are not discussed again in detail.

The optical assembly 34 can be understood to be a combination of the optical assemblies 29 and 32; i.e., it has, in each case, a further mirror 30, 33 in the beam path of the output beam 2a, both between the second GI mirror 25 and the hollow waveguide 27 and between the hollow waveguide 27 and the field facet mirror 15.

Figure 8:
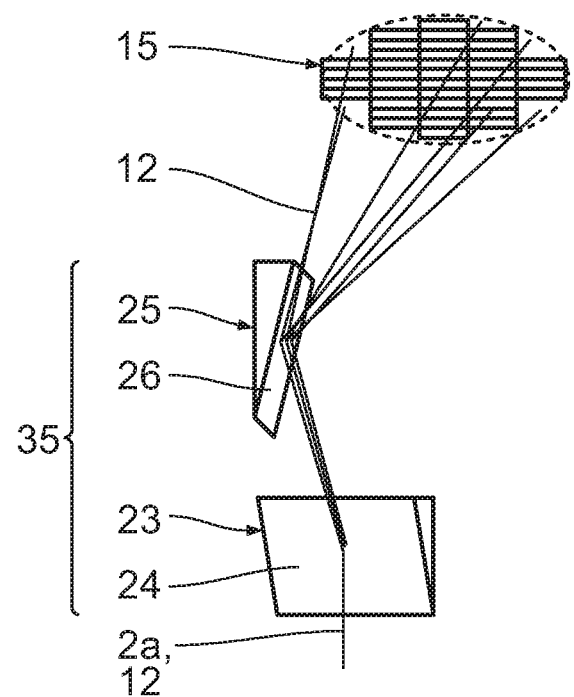

With reference to FIG. 8, an explanation is given below of a further embodiment of an optical assembly 35, which can be used instead of the optical assembly 13 in the projection exposure apparatus 4 according to FIG. 1. Component parts and functions which were already explained above with reference to FIGS. 1 to 7 have the same reference signs and are not discussed again in detail.

In comparison with the embodiment of the optical assembly 13 according to FIG. 2, the hollow waveguide 27 has been omitted in the optical assembly 35. The output beam 2a is directly incident on the field facet mirror 15 after reflection at the second GI mirror 25.

Figure 9:
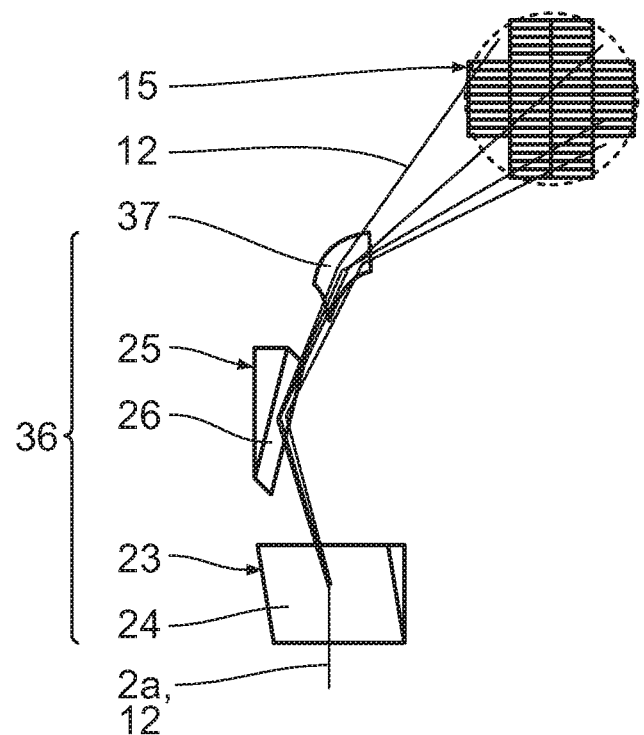

With reference to FIG. 9, an explanation is given below of a further embodiment of an optical assembly 36, which can be used instead of the optical assembly 13 in the projection exposure apparatus 4 according to FIG. 1. Component parts and functions which were already explained above with reference to FIGS. 1 to 8 have the same reference signs and are not discussed again in detail.

The optical assembly 36 can be understood to be an addition to the optical assembly 35 according to FIG. 8. In the optical assembly 36, a further mirror 37 with a curved reflection surface is arranged in the beam path of the output beam 2a, namely in the beam path between the second GI mirror 25 and the field facet mirror 15. A function of this further mirror 37 corresponds to that which was explained above, with reference to the optical assembly 29, in the context of the mirror 31.

In an alternative configuration, the mirror 37 contains an acousto-optic modulator. The acousto-optic modulator allows a high-frequency change in the form or the topography of the reflection surface of the mirror 37. The frequency with which the form of the reflection surface of the mirror 37 can be modified may be greater than 1 kHz, greater than 50 kHz, greater than 1 MHz or else greater than 50 MHz. In particular, the frequency may be greater than or equal to the frequency with which the light source 2 is pulsed. Advantageously, such a high-frequency change in form of the reflection surface of the mirror 37 may reduce the effect of possibly present speckles when a wafer 11 is exposed with the projection exposure apparatus 4.

Figure 17:
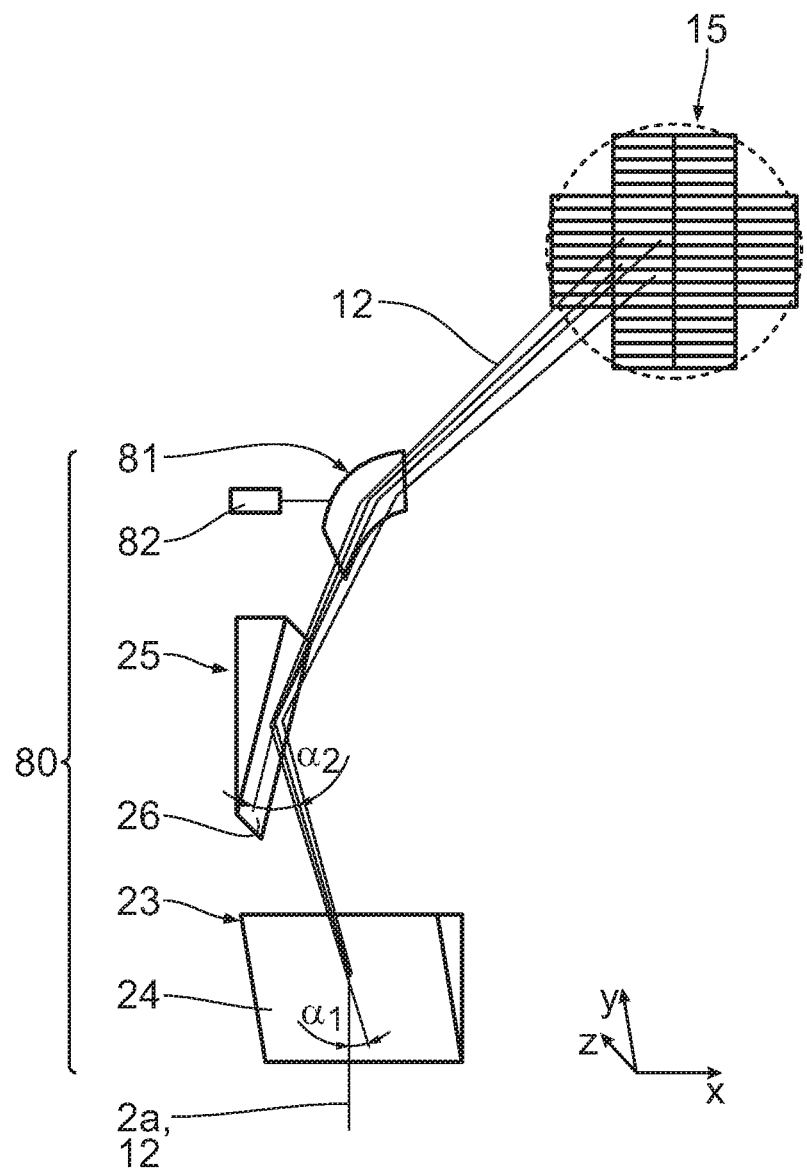
FIG. 17 shows a further embodiment of an optical assembly, which can be used in place of the one according to FIG. 2.

With reference to FIG. 17, an explanation is given below of a further embodiment of an optical assembly 80, which can be used instead of the optical assembly 13 in the projection exposure apparatus 4 according to FIG. 1. Component parts and functions which were already explained above have the same reference signs and are not discussed again in detail.

The assembly 80 includes a mirror 81 at the location of the mirror 37 of the embodiment according to FIG. 9, the mirror 81 being able to be moved by an actuator 82. The mirror 81 may be plane or have refractive power. The instantaneous illumination of the facet mirror 15 with EUV radiation 12 is smaller than the extent of the facet mirror and amounts to 20%, 10% or an even smaller percentage of the area of the facet mirror 15, for example. By actuating the actuator 82, the mirror 81 is moved such that the whole facet mirror 15 is illuminated in an integral fashion. The time period within which the entire facet mirror 15 is illuminated is shorter than the time period within which a point on the wafer 11 passes through the image field 7. The time period within which the whole facet mirror 15 is illuminated may be shorter than 10 ms, shorter than 1 ms and shorter than 0.1 ms, in particular. The mirror 81 may be embodied as a scanning mirror such that a point of incidence of the output beam 12 on the facet mirror 15 is scanned over the facets 16 of the facet mirror 15 by way of the actuator 82.

The instantaneous extent of the EUV radiation 12 incident on the facet mirror 15 can be smaller than the extent of a facet 16 of the facet mirror in each direction; i.e., the vertical extent of the illuminated spot is smaller than the vertical extent of a facet and the horizontal extent of the spot is smaller than the horizontal extent of a facet. Such a configuration can advantageously prevent the occurrence of speckle or reduce the intensity of possibly occurring speckles.

Figure 10:
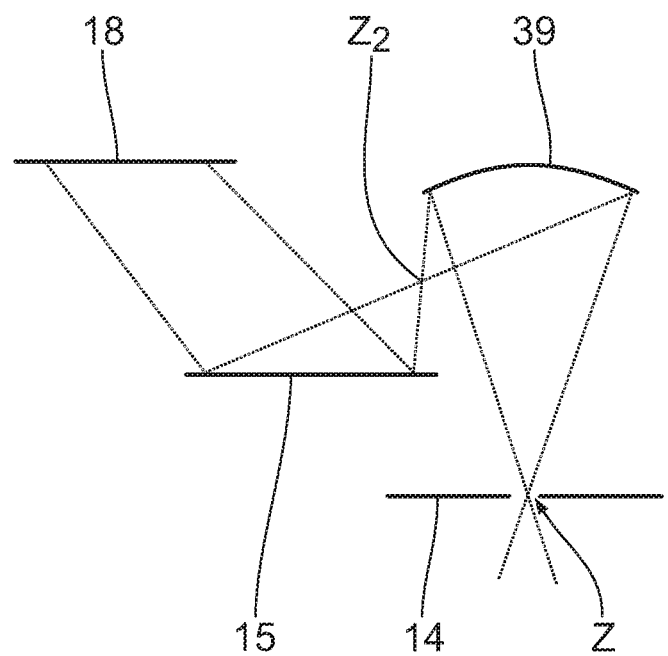
FIG. 10 very schematically shows a beam path of the output beam of the FEL after guidance through one of the above embodiments along the course through principal component parts of the downstream illumination-optical assembly.

With reference to FIG. 10, an explanation is given below of an alternative design of an illumination-optical assembly, which can be used instead of the illumination-optical assembly according to FIG. 1 with the facet mirrors 15, 18.

Component parts and functions which correspond to those already explained above with reference to FIGS. 1 to 9, and in particular with reference to FIG. 1, have the same reference signs and are not discussed again in detail.

In the illumination-optical assembly according to FIG. 10, a mirror 39 with a curved reflection surface is arranged between the intermediate focus Z and the field facet mirror 15. In contrast to the embodiment according to FIGS. 5 and 9, for example, this mirror 39 according to FIG. 10 is not a constituent part of the illumination-optical assembly for guiding the output beam 2a to the downstream illumination-optical assembly for defining an illumination angle distribution of the illumination light 12 over the object field 6; in fact, it is a constituent part of this optical assembly for defining the illumination angle distribution. The mirror 39 serves to form an illumination of the illumination light 12 on the field facet mirror 15. As a matter of principle, and apart from the assignment of the mirror 39 to the respective optical assembly, the function of the mirror corresponds to that of the mirror 31 of the embodiment according to FIG. 5 or of the mirror 37 in the embodiment according to FIG. 9. The mirror 39 can be an NI mirror. A further intermediate focus $Z_2$ of the illumination light beam path may lie between the mirror 39 and the field facet mirror 15.

The illumination-optical arrangement according to FIG. 10 may be combined with one of those arrangements which were already explained above in conjunction with FIGS. 2 to 9. Instead of illuminating the field facet mirror 15, which is effectuated in these embodiments explained above, the mirror 39 is illuminated then.

Figure 11:
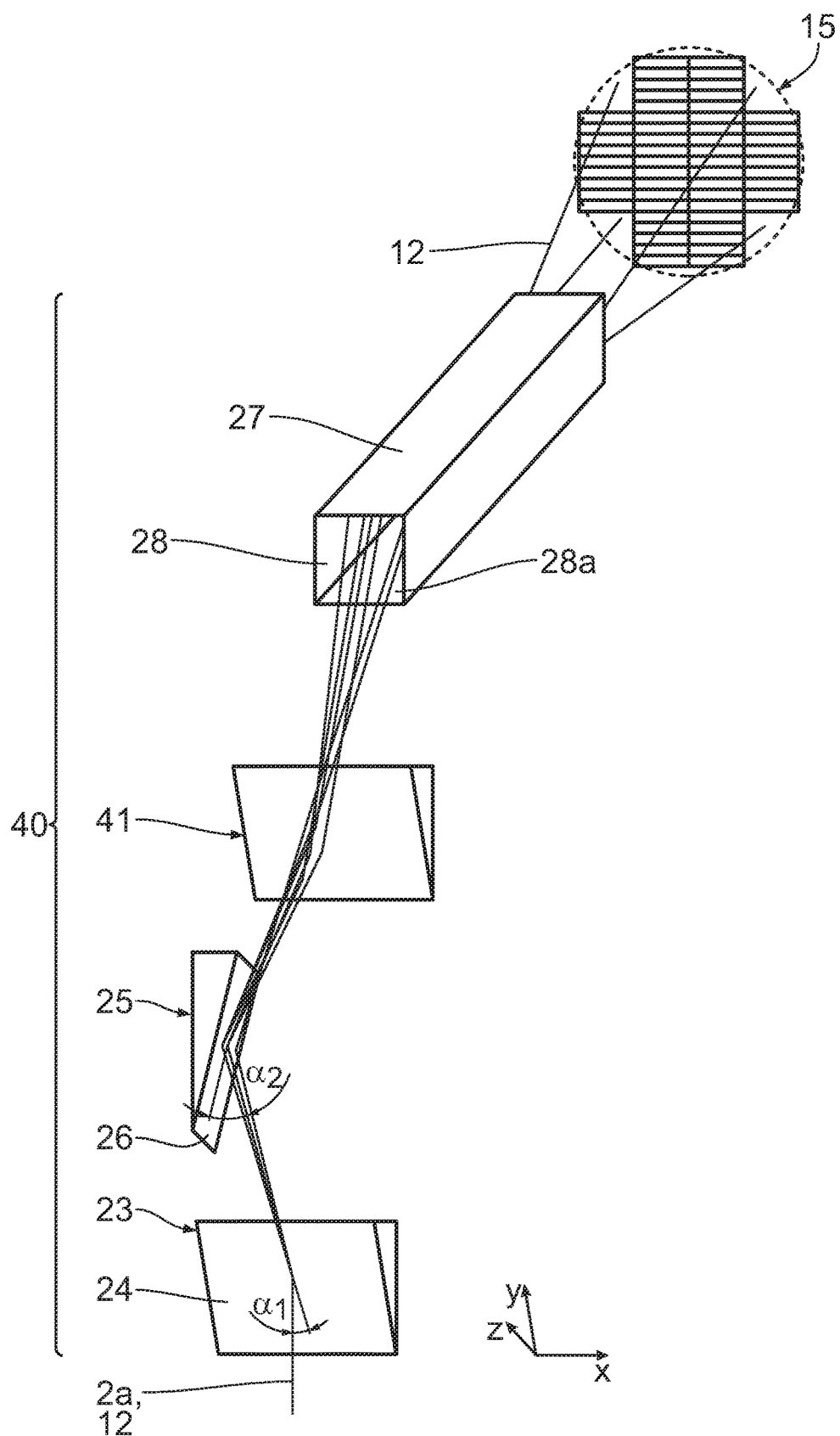
FIGS. 11 and 12 show further embodiments of an optical assembly, which can be used in place of the one according to FIG. 2.

With reference to FIG. 11, an explanation is given below of a further embodiment of an optical assembly 40, which can be used instead of the optical assembly 13 in the projection exposure apparatus 4 according to FIG. 1. Component parts and functions which were already explained above with reference to FIGS. 1 to 10 have the same reference signs and are not discussed again in detail.

In contrast to the embodiment according to FIG. 6, a third GI mirror 41 is present between the second GI mirror 25 and the hollow waveguide 27 in the optical assembly 40 according to FIG. 11, the construction of the third GI mirror corresponding to that of the GI mirrors 23, 25. An arrangement of the third GI mirror 41 is once again such that it reflects the output beam 2a in a plane of incidence yz, i.e. in the plane of incidence of the first GI mirror 23. Therefore, the third GI mirror 41 leads to a further increase in the divergence of the output beam 2a in the yz-plane. This may also be used for adapting or conditioning the desired properties placed on the output beam 2a by the hollow waveguide 27 at the input side. In this respect, the function of the third GI mirror 41 corresponds to that of the mirror 33 of the optical assembly 32 according to FIG. 6.

In an embodiment variant, the two GI mirrors 23 and 25 are provided with a scattering effect, in particular being able to have planar surfaces as illustrated in FIG. 3 apart from the scattering effect, while the third GI mirror 41 has no scattering effect and can be embodied as illustrated in FIG. 4, in particular.

The sequence of the GI mirrors 25 and 41 may also be reversed such that the GI mirror 41 is first and only followed by the GI mirror 25 in the beam path downstream of the GI mirror 23 through which the EUV radiation 12 passes. Thus, there initially is an increase in the divergence in a plane vi two GI mirrors, before the divergence is increased in a plane orthogonal thereto. This embodiment can be generalized to the effect of using more than two GI mirrors for increasing the divergence in one plane or using at least two GI mirrors in each case for increasing the divergence in two mutually orthogonal planes. If there already is a sufficient increase in the divergence as a result of these GI mirrors 23, 25, 41, . . ., it is also possible to dispense with the hollow waveguide 27.

Figure 12:
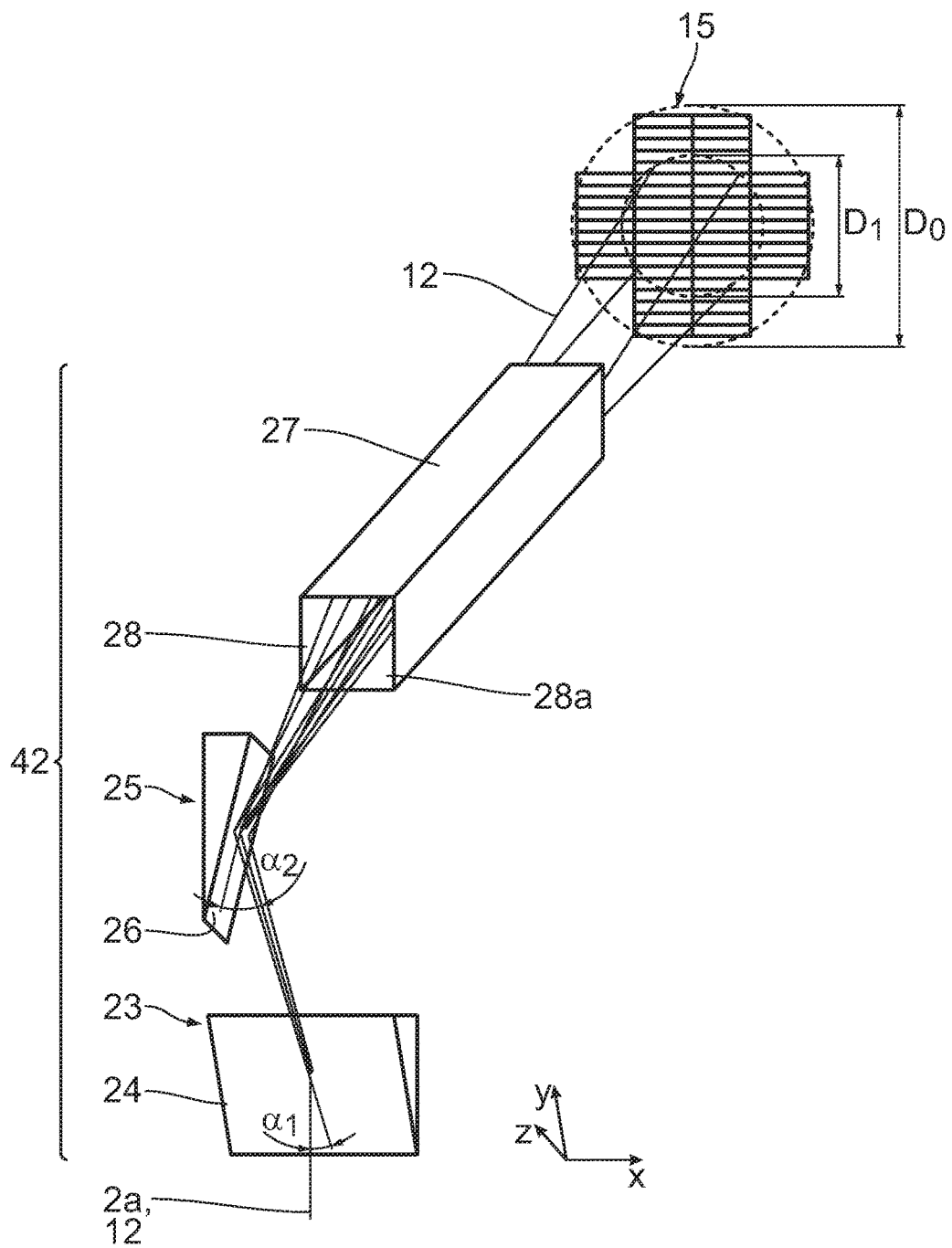

With reference to FIG. 12, an explanation is given below of a further embodiment of an optical assembly 42, which can be used instead of the optical assembly 13 in the projection exposure apparatus 4 according to FIG. 1. Component parts and functions which were already explained above with reference to FIGS. 1 to 11 have the same reference signs and are not discussed again in detail.

The optical assembly 42 serves to upgrade an already existing illumination optical unit of a projection exposure apparatus; i.e., it serves as an upgrade assembly. The optical assembly 42 acts in such a way that it does not illuminate an entire diameter D0 of the field facet mirror 15 of the existing illumination optical unit, but, in comparison therewith, a reduced diameter D1.

Advantageously, the illumination optical unit 1 of the projection exposure apparatus 4 is designed such that desired illumination properties of the object field 6 are achieved both when illuminating the field facet mirror 15 with the diameter D0 and when illuminating with the diameter D1. In particular, this can be achieved by suitable assignment of the pupil facets 17 of the pupil facet mirror 18 to field facets 16 of the field facet mirror 15.

Figure 19:
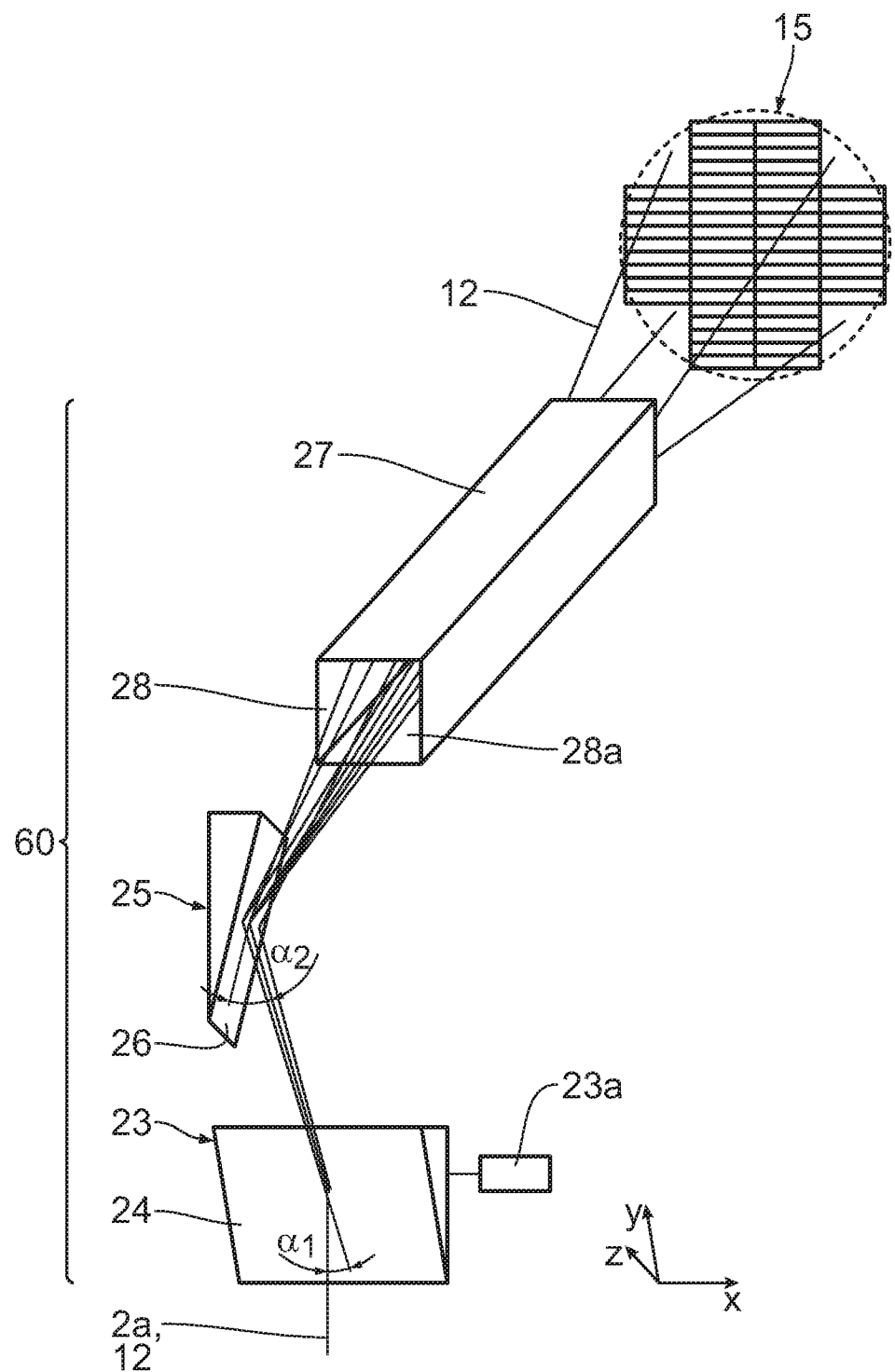
FIG. 19 shows a further embodiment of an optical assembly, which can be used in place of the one according to FIG. 2.

With reference to FIG. 19, an explanation is given below of a further embodiment of an optical assembly 60, which can be used instead of the optical assembly 13 according to FIG. 2. Component parts and functions which were explained above in conjunction with the other embodiments of the optical assemblies for guiding the output beam 2a have the same reference signs and are not discussed again in detail.

The GI mirror 23 is connected to an actuator 23a in the optical assembly 60. The actuator 23a can move the GI mirror 23 in one or two mutually orthogonal directions. The movement may be such that it is not effectuated along the y-direction as this would involve very long travels of the actuator and, moreover, an equivalent effect can be achieved with much shorter travels by way of a movement along the z-axis. The amplitude of the movement can be at least so large that there is a displacement of the GI mirror 23 which is greater than the diameter of the illumination spot of EUV radiation 12 of the output beam 2a on the GI mirror. The frequency of this movement can be greater than 100 Hz, greater than 1 kHz, in particular greater than 10 kHz. As a result of this, a local heating of the reflection surface 24 can be reduced.

In the case of a configuration of the reflection surface 24 of the GI mirror 23 according to FIG. 3 or FIG. 15, the actuator 23a can move the GI mirror in two mutually orthogonal directions. In a further configuration of the reflection surface 24 of the GI mirror 23 according to FIG. 4, the actuator 23a can move the GI mirror in a direction which is orthogonal to the plane of incidence of the EUV radiation 12.

Figure 13:
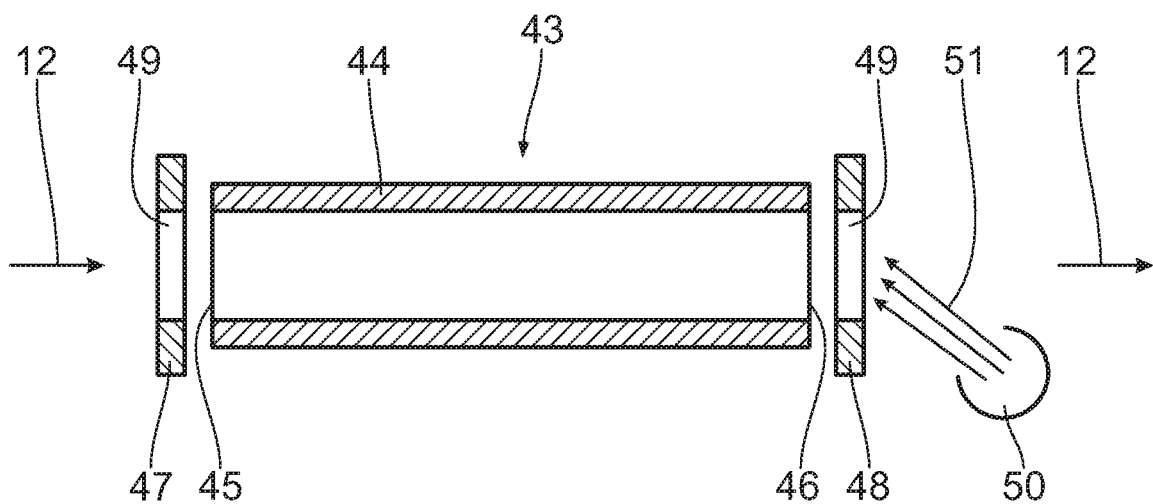
FIG. 13 shows a hollow waveguide assembly as a constituent part of a superordinate optical assembly according to one of the preceding embodiments.

With reference to FIG. 13, an explanation is given below of a hollow waveguide assembly 43, which can be used instead of the hollow waveguide 27 of the above-described embodiments of the optical assembly. The hollow waveguide assembly 43 has a hollow waveguide 44 in the style of the hollow waveguide 27, as described in the embodiments explained above. The hollow waveguide 44 serves to guide an EUV light beam 12 along a beam path between an entrance 45 and an exit 46 of the hollow waveguide 44. A first electrode 47 of the hollow waveguide assembly 43 is arranged in the vicinity of the entrance 45. A second electrode 48 of the hollow waveguide assembly 43 is arranged in the vicinity of the exit 46. The first electrode 47 can be an anode and the second electrode 48 can be a cathode. The two electrodes 47, 48 are embodied as ring electrodes, the respective ring openings 49 of which are embodied for the passage of the EUV light beam 12.

The hollow waveguide assembly 43 furthermore includes an ionization light source 50 which causes impingement on a region of a beam path of the EUV light beam 12 in the vicinity of the second electrode 48. The ionization light source 50 can be a gas discharge lamp which may have an open, i.e. window-free, embodiment toward the ring opening 49 of the second electrode 48. An emission wavelength of an ionization radiation 51 of the ionization light source 50 lies in the range of between 70 nm and 90 nm. With this impingement on the beam path of the EUV light 12, there can be an ionization of hydrogen carried along in the beam path. The positively charged hydrogen ions are then transported away to the second electrode 47 in the direction of the beam path of the EUV beam 12. In this way, gas particles, in particular hydrogen, are moved away from the FEL 2 and cannot undesirably disturb the latter. The wavelength of the ionization light source 50 leads to photon energy that is greater than the ionization threshold of hydrogen.

The hollow waveguide assembly 43 consequently ensures a good separation between a gas space, in which the component parts of an illumination optical unit disposed downstream of the hollow waveguide 44 are arranged, and a space that is evacuated to the best possible extent, in which the FEL 2 is arranged.

Figure 18:
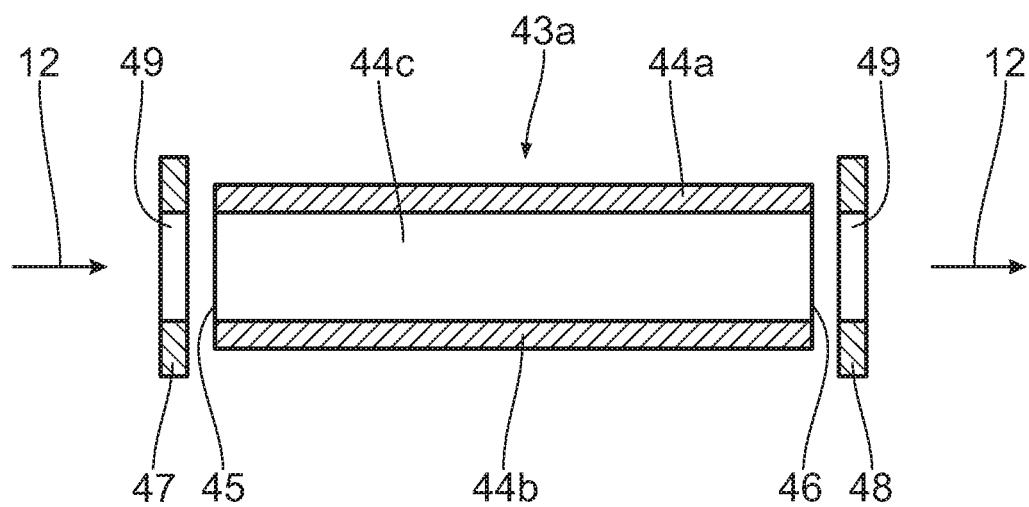
FIG. 18 shows a hollow waveguide assembly as a constituent part of a superordinate optical assembly according to one of the preceding embodiments.

With reference to FIG. 18, an explanation is given of an alternative configuration of a hollow waveguide assembly 43*a*, which can be used instead of the hollow waveguide assembly 43 according to FIG. 13. Component parts and functions which were already explained above on the basis of FIG. 13 have the same reference signs and are not discussed again in detail.

The hollow waveguide 44 of the hollow waveguide assembly 43*a* consists of two regions 44*a*, 44*b*, which each have an electrically conductive embodiment. Regions 44*c*, which are electrically insulating, are situated between the regions 44*a*, 44*b*. By applying a sufficiently large voltage between the regions 44*a* and 44*b*, it is possible to achieve an ionization of gas particles, in particular hydrogen, situated in the beam path of the EUV beam 12.

Figure 14:
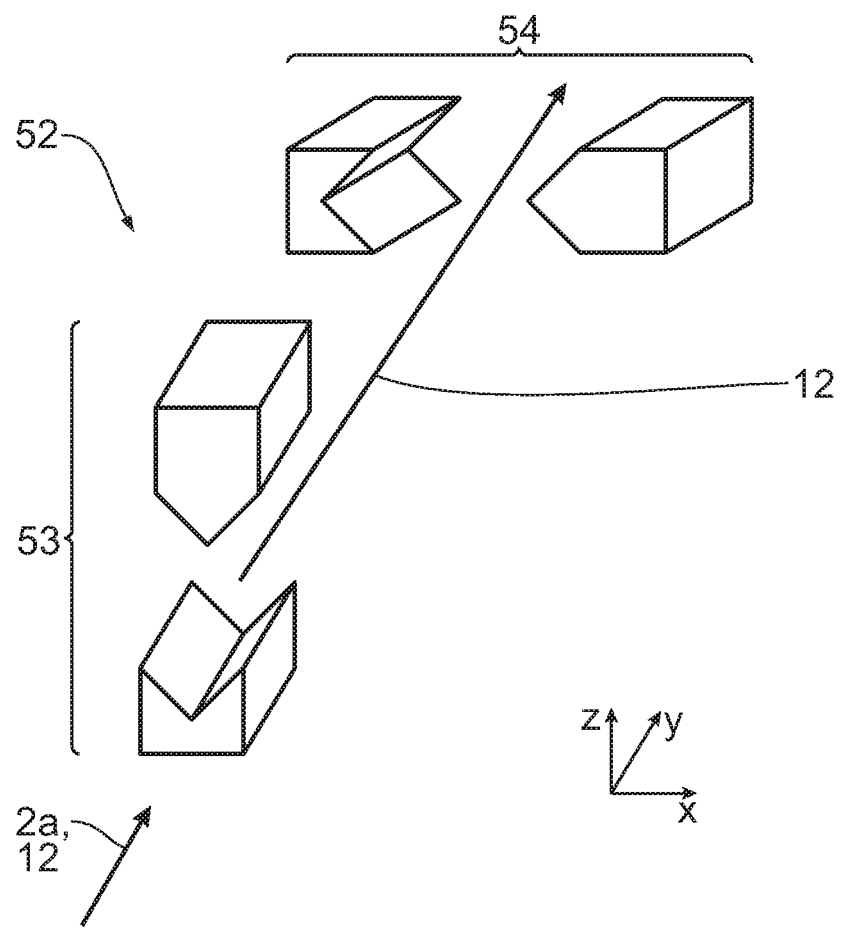
FIG. 14 shows a magnet arrangement as a constituent part of a superordinate optical assembly according to one of the preceding embodiments.

Using FIG. 14, a magnet arrangement 52 is explained below, the magnet arrangement being able to be used as a constituent part of one of the embodiments, described above, of an optical assembly for guiding the output beam 2*a* or being able to serve, in general, as a constituent part of an optical system of a projection exposure apparatus in the style of the projection exposure apparatus 4.

The magnet arrangement 52 has two magnet pole shoe pairs 53, 54 for producing an inhomogeneous magnetic field in each case. Magnetic field lines of the first pole shoe pair 53 in the beam path of the output beam 2*a* extend substantially in the direction of the z-axis. Magnetic field lines of the downstream second pole shoe pair 54 extend substantially parallel to the x-direction. By way of the inhomogeneous magnetic fields produced thus in two planes, it is possible, in a targeted manner, to deflect and remove mirror or coating particles, in particular ruthenium atoms, which are carried along with the output beam 2*a* or the EUV radiation 12. This results in effective purging of unwanted carried-along metal particles, in particular of atoms that originate from the reflection surfaces of mirrors involved and that are carried along in an unwanted manner, for example as a result of ablation with the EUV radiation 12.

The second pole shoe pair 54 is dispensed with in an alternative embodiment. Particularly if the atoms to be removed have a half integer total angular momentum, this may lead to a simpler setup of the magnet arrangement 52, without a significant deterioration in the capability of deflecting such atoms.

The addition of further pole shoe pairs to the magnet arrangement 52 can increase the effectiveness of the purge, particularly for atoms to be removed having an integer total angular momentum. Here, adjacent pole shoe pairs are rotated in relation to one another, preferably by approximately 90°.

In order to produce a microstructured or nanostructured component, the projection exposure apparatus 4 is used as follows: Initially, the reticle 10 and the wafer 11 are provided. Then, a structure on the reticle 10 is projected onto a light-sensitive layer of the wafer 11 with the aid of the projection exposure apparatus 4. By developing the light-sensitive layer, a microstructure is then generated on the wafer 11 and the microstructured or nanostructured component is consequently produced.

What is claimed is:

1. An optical assembly, comprising:
   a first GI mirror comprising a structured first reflection surface configured to be impinged upon by a beam at a first angle of incidence in a first plane of incidence between the beam and the first reflection surface, the first angle of incidence being between one mrad and 10 mrad, the structured first reflection surface being configured to produce a maximum first scattering angle of the beam amounting to at least 50% and at most 100% of the first angle of incidence;
   a second GI mirror downstream of the first GI mirror in a beam path of the beam, the second GI mirror comprising a structured second reflection surface configured to be impinged upon by the beam at a second angle of incidence in a second plane of incidence between the beam and the second reflection surface, the second plane of incidence including an angle with the first plane of incidence that is greater than 45°, the second angle of incidence being at least twice as large as the first angle of incidence, the structured second reflection surface configured to produce a maximum second scattering angle of the beam amounting to at least 30% and at most 100% of the second angle of incidence; and
   a hollow waveguide in the beam path of the output beam after the second GI mirror.

2. The optical assembly of claim 1, wherein the beam is an EUV light beam.

3. The optical assembly of claim 1, wherein the beam is an output beam of a free electron laser.

4. The optical assembly of claim 1, wherein the first GI mirror is configured so that a beam path between a source of the beam and the first GI mirror is shorter than eight meters.

5. The optical assembly of claim 1, wherein the first GI mirror is configured so that, when the output beam is linearly polarized, the first GI mirror reflects the latter with s-polarization.

6. The optical assembly of claim 1, wherein reflecting inner surfaces of the hollow waveguide have an angle of between 10° and 80° in relation to at least one of the planes of incidence.

7. The optical assembly of claim 1, further comprising a further mirror downstream of the hollow waveguide, wherein the further mirror is configured to shape the beam of the output beam after emergence from the hollow waveguide.

8. The optical assembly of claim 1, further comprising a further mirror between the second GI mirror and the hollow waveguide in the beam path of the output beam, wherein the further mirror is configured to shape the beam of the output beam before entry into the hollow waveguide.

9. The optical assembly of claim 1, further comprising:
a third mirror downstream of the hollow waveguide; and
a fourth mirror between the second GI mirror and the hollow waveguide in the beam path of the output beam,
wherein:
reflecting inner surfaces of the hollow waveguide have an angle of between 10° and 80° in relation to at least one of the planes of incidence;
the third mirror is configured to shape the beam of the output beam after emergence from the hollow waveguide; and
the fourth mirror is configured to shape the beam of the output beam before entry into the hollow waveguide.

10. The optical assembly of claim 1, further comprising a hollow waveguide assembly which comprises:
the hollow waveguide;
a first electrode close to an entry of the beam into the hollow waveguide;
a second electrode close to an exit of the beam from the hollow waveguide; and
an ionization light source configured to cause impingement on a region of the beam path near at least one of the first and second electrodes.

11. The optical assembly of claim 1, further comprising a magnet arrangement which comprises a first magnet pole shoe pair configured to produce a first magnetic field with field lines that extend transversely to the beam path.

12. The optical assembly of claim 11, further comprising a second magnet pole shoe pair configured to produce a second magnetic field with field lines that extend transversely to the beam path and transversely to the field lines of the first magnet pole shoe pair.

13. An illumination optical unit, comprising:
an optical assembly according to claim 1,
wherein the optical assembly is configured to illuminate an object field with the beam as illumination light, and the illumination optical unit is a microlithography illumination optical unit.

14. An optical system, comprising:
an optical assembly according to claim 1; and
a projection optical unit,
wherein the optical assembly is configured to illuminate an object field with the beam as illumination light, and the projection optical unit is configured to image the object field into an image field.

15. An apparatus, comprising:
an FEL configured to provide the beam;
an optical assembly according to claim 1; and
a projection optical unit,
wherein the optical assembly is configured to illuminate an object field with the beam as illumination light, the projection optical unit is configured to image the object field into an image field, and the apparatus is a microlithography projection exposure apparatus.

16. A method of using a microlithography projection exposure apparatus comprising an optical assembly and a projection optical unit, the method comprising:
using the optical assembly is configured to illuminate an object field with a beam as illumination light; and
using the projection optical unit to image the object field into an image field,
wherein the optical assembly is an optical assembly according to claim 1.

17. The optical assembly of claim 1, wherein:
the beam is an EUV light beam;
the hollow waveguide is configured to guide the EUV light beam along the beam path; and
the hollow waveguide comprises:
a first electrode close to an entry of the EUV light beam into the hollow waveguide;
a second electrode close to an exit of the EUV light beam from the hollow waveguide; and
an ionization light source configured to cause impingement on a region of the beam path of the EUV light beam near at least one of the first and second electrodes.

18. The optical arrangement of claim 1, wherein:
the beam is an EUV light beam; and
the optical arrangment further comprises a magnet arrangement, which comprises a first magnet pole shoe pair configured to produce a first magnetic field with field lines that extend transversely to the beam path.

19. The optical arrangement of claim 18, further comprising a second magnet pole shoe pair configured to produce a second magnetic field with field lines that extend transversely to the beam path and transversely to the field lines of the first magnet pole shoe pair.

* * * * *

UNITED STATES PATENT AND TRADEMARK OFFICE
CERTIFICATE OF CORRECTION

PATENT NO. : 10,928,734 B2  
APPLICATION NO. : 16/579398  
DATED : February 23, 2021  
INVENTOR(S) : Michael Patra Page 1 of 1

It is certified that error appears in the above-identified patent and that said Letters Patent is hereby corrected as shown below:

On the Title Page

Column 2 (item (57), Abstract), Line 7, delete "mrd" and insert -- mrad --;

In the Specification

Column 1, Lines 7-8, delete "PCT/EP 2018/057 167" and insert -- PCT/EP2018/057167 --;

In the Claims

Column 20, Line 34, Claim 18, delete "arrangement" and insert -- assembly --;

Column 20, Line 36, Claim 18, delete "arrangment" and insert -- assembly --;

Column 20, Line 40, Claim 19, delete "arrangement" and insert -- assembly --.

Signed and Sealed this  
Fourth Day of May, 2021

Drew Hirshfeld  
*Performing the Functions and Duties of the*  
*Under Secretary of Commerce for Intellectual Property and*  
*Director of the United States Patent and Trademark Office*